(12) United States Patent
Lee et al.

(10) Patent No.: US 12,532,477 B2
(45) Date of Patent: Jan. 20, 2026

(54) THREE-DIMENSIONAL (3D) SEMICONDUCTOR MEMORY DEVICE AND METHOD OF MANUFACTURING THE SAME

(71) Applicant: Samsung Electronics Co., Ltd., Suwon-si (KR)

(72) Inventors: Jeon Il Lee, Suwon-si (KR); Min Hee Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 408 days.

(21) Appl. No.: 18/171,858

(22) Filed: Feb. 21, 2023

(65) Prior Publication Data

US 2023/0422511 A1  Dec. 28, 2023

(30) Foreign Application Priority Data

Jun. 22, 2022   (KR) ......................... 10-2022-0076036

(51) Int. Cl.
| | | |
|---|---|---|
| *H10B 51/20* | (2023.01) | |
| *H01L 23/522* | (2006.01) | |
| *H01L 23/528* | (2006.01) | |
| *H10B 51/10* | (2023.01) | |
| *H10B 51/40* | (2023.01) | |
| *H10D 64/68* | (2025.01) | |

(52) U.S. Cl.
CPC ......... *H10B 51/20* (2023.02); *H01L 23/5226* (2013.01); *H01L 23/5283* (2013.01); *H10B 51/10* (2023.02); *H10B 51/40* (2023.02); *H10D 64/689* (2025.01)

(58) Field of Classification Search
CPC ........ H10B 51/20; H10B 51/10; H10B 51/40; H10B 51/30; H10B 51/50; H01L 23/5226; H01L 23/5283; H10D 64/689; H10D 64/033
See application file for complete search history.

(56) References Cited

U.S. PATENT DOCUMENTS

| | | | |
|---|---|---|---|
| 5,640,259 | A | 6/1997 | Sawayama et al. |
| 2021/0375933 | A1 | 12/2021 | Lu et al. |
| 2021/0375935 | A1 | 12/2021 | Ling et al. |
| 2021/0375938 | A1 | 12/2021 | Lin et al. |

(Continued)

FOREIGN PATENT DOCUMENTS

| | | |
|---|---|---|
| JP | 2974564 B2 | 11/1999 |
| KR | 10-2021-0148847 A | 12/2021 |
| KR | 10-2021-0148854 A | 12/2021 |

*Primary Examiner* — Allison Bernstein
(74) *Attorney, Agent, or Firm* — Fish & Richardson P.C.

(57) ABSTRACT

A 3D semiconductor memory device includes a first through-structure on a substrate, the first through-structure comprising first and second conductive pillars spaced apart from each other in a first direction, an electrode adjacent to the first through-structure, the electrode horizontally extending in the first direction, and a ferroelectric layer and a channel layer between the electrode and the first and second conductive pillars. The channel layer connects the first and second conductive pillars to each other. The ferroelectric layer is disposed between the electrode and the channel layer. The ferroelectric layer extends from a sidewall of the first conductive pillar to a sidewall of the second conductive pillar along the channel layer when viewed in a plan view.

19 Claims, 27 Drawing Sheets

(56) References Cited

U.S. PATENT DOCUMENTS

| | | |
|---|---|---|
| 2021/0399017 A1 | 12/2021 | Sun et al. |
| 2021/0407980 A1* | 12/2021 | Young .................... H10B 51/20 |
| 2021/0408046 A1 | 12/2021 | Chang et al. |
| 2021/0408047 A1 | 12/2021 | Wang et al. |
| 2022/0037362 A1* | 2/2022 | Lin .................... H10D 30/0415 |
| 2022/0052060 A1 | 2/2022 | Young et al. |

* cited by examiner

THREE-DIMENSIONAL (3D) SEMICONDUCTOR MEMORY DEVICE AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2022-0076036, filed on Jun. 22, 2022, in the Korean Intellectual Property Office, the entire contents of which are hereby incorporated by reference.

BACKGROUND OF THE INVENTION

The present disclosure relates to a three-dimensional (3D) semiconductor memory device and a method of manufacturing the same, and more particularly, to a three-dimensional ferroelectric memory device and a method of manufacturing the same.

Semiconductor memory devices may be classified into volatile memory devices and non-volatile memory devices. The volatile memory devices may lose their stored data when their power supplies are interrupted, and, for example, the volatile memory devices may be or include dynamic random access memory (DRAM) devices, static random access memory (SRAM) devices, and/or the like. On the contrary, the non-volatile memory devices may retain their stored data even when their power supplies are interrupted, and, for example, the non-volatile memory devices may be or include programmable ROM (PROM) devices, erasable PROM (EPROM) devices, electrically EPROM (EEPROM) devices, flash memory devices, and/or the like. In addition, next-generation semiconductor memory devices (e.g., magnetic random access memory (MRAM) devices, phase-change random access memory (PRAM) devices, ferroelectric random access memory (FeRAM) devices, etc.) have been developed to provide high-performance and low power consumption semiconductor memory devices.

Various techniques using semiconductor devices having different properties are being studied to improve an integration density and performance of semiconductor devices.

SUMMARY

Example embodiments of the inventive concepts may provide a three-dimensional (3D) semiconductor memory device with improved electrical characteristics.

Example embodiments of the inventive concepts may also provide a method of manufacturing a three-dimensional (3D) semiconductor memory device with improved electrical characteristics.

In an aspect, a three-dimensional (3D) semiconductor memory device may include a first through-structure on a substrate, the first through-structure comprising a first conductive pillar and a second conductive pillar spaced apart from each other in a first direction, an electrode adjacent to the first through-structure, the electrode horizontally extending in the first direction, and a ferroelectric layer and a channel layer between the electrode and the first and second conductive pillars. The channel layer may connect the first and second conductive pillars to each other. The ferroelectric layer may be between the electrode and the channel layer. The ferroelectric layer may extend from a sidewall of the first conductive pillar to a sidewall of the second conductive pillar along the channel layer when viewed in a plan view such that the ferroelectric layer is in contact with the sidewall of the first conductive pillar and the sidewall of the second conductive pillar.

In an aspect, a 3D semiconductor memory device may include a first through-structure and a second through-structure on a substrate, the first and second through-structures spaced apart in a first direction, and each comprising a first conductive pillar and a second conductive pillar spaced apart from each other in the first direction; an electrode extending horizontally in the first direction such that the electrode is adjacent to the first and second through-structures; a first memory cell between the electrode and the first through-structure; and a second memory cell between the electrode and the second through-structure. Each of the first and second memory cells may include a ferroelectric layer and a channel layer. The electrode may extend from the first memory cell to the second memory cell while having a constant line width.

In an aspect, a 3D semiconductor memory device may include an electrode structure comprising a plurality of electrodes stacked on a substrate, the electrode structure extending in a first direction; a first through-structure adjacent to a first side of the electrode structure; a second through-structure adjacent to a second side, opposite to the first side, of the electrode structure; a first cell string between the electrode structure and the first through-structure; a second cell string between the electrode structure and the second through-structure; and interconnection lines on the first and second cell strings. Each of the first and second through-structures may include a first conductive pillar and a second conductive pillar spaced apart from each other in the first direction. Each of the first and second cell strings may include a channel layer connecting the first conductive pillar and the second conductive pillar, and a ferroelectric layer between the channel layer and the electrode structure. The first through-structure may be offset from the second through-structure in the first direction by a first pitch.

In an aspect, a method of manufacturing a 3D semiconductor memory device may include forming, on a substrate, an electrode structure and a trench defining the electrode structure such that the electrode structure extends in a first direction, the electrode structure including a stack of alternating insulating layers and electrodes; forming an isolation insulating layer filling the trench defining the electrode structure; forming a cell-open hole penetrating the isolation insulating layer, the cell-open hole exposing a sidewall of the electrode structure; sequentially forming a ferroelectric layer and a channel layer in the cell-open hole; and forming a first conductive pillar penetrating a first portion of the channel layer and a second conductive pillar penetrating a second portion of the channel layer.

DETAILED DESCRIPTION

Figure 1:
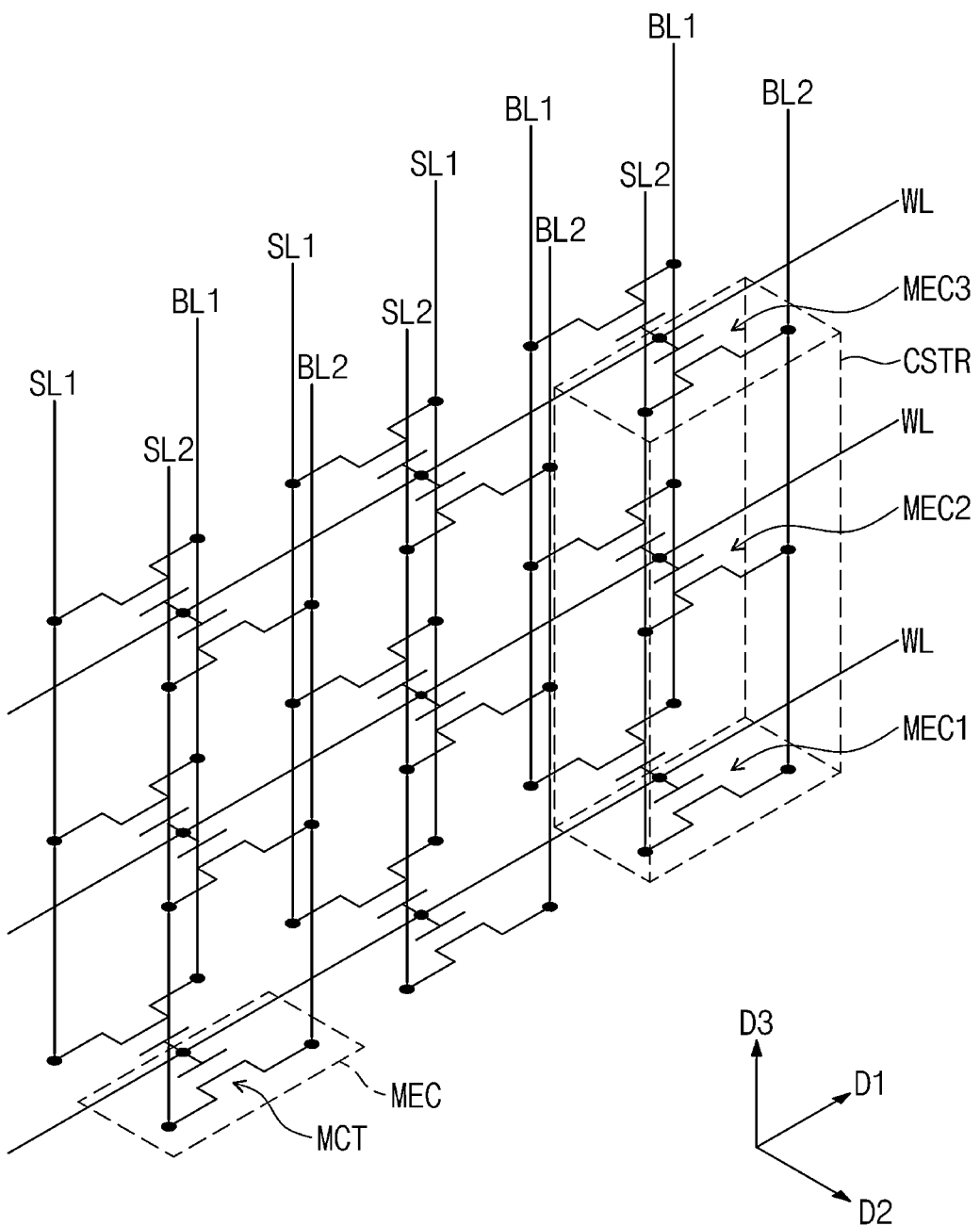
FIG. 1 is a schematic circuit diagram illustrating a cell array of a three-dimensional (3D) semiconductor memory device according to some embodiments of the inventive concepts.

Reference will now be made in detail to various embodiments, examples of which are illustrated in the accompanying drawings. In this regard, various example embodiments may have different forms and should not be construed as being limited to the descriptions set forth herein. For example, hereinafter, thicknesses of the layers or regions shown in the drawings may be exaggerated for clarity of the specification. The example embodiments are capable of various modifications and may be embodied in many different forms.

In addition, when an element or layer is referred to as being "on" or "above" another element or layer, the element or layer may be directly on another element or layer or intervening elements or layers. It will be understood that the spatially relative terms are intended to encompass different orientations of the device in use or operation in addition to the orientation depicted in the figures. For example, if the device in the figures is otherwise oriented (e.g., rotated 90 degrees or at other orientations), the spatially relative descriptors used herein are to be interpreted accordingly. Terms such as "first", "second", "third", and the like may be used to describe various components but are used only for the purpose of distinguishing one component from other components, and the order, type, and/or the like of the components are not limited.

As used herein, the terms "or" and/or "and/or" includes any and all combinations of one or more of the associated listed items. Expressions such as "at least one of," when preceding a list of elements, modify the entire list of elements and do not modify the individual elements of the list.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

FIG. 1 is a schematic circuit diagram illustrating a cell array of a three-dimensional (3D) semiconductor memory device according to some embodiments of the inventive concepts. Referring to FIG. 1, a 3D semiconductor memory device, according to some embodiments of the inventive concepts, may include word lines WL, bit lines BL, source lines SL, and memory cell transistors MCT.

The bit and source lines BL and SL may vertically extend in a third direction D3. The bit lines BL may include a pair of first and second bit lines BL1 and BL2 adjacent to each other in a second direction D2. The source lines SL may include a pair of first and second source lines SL1 and SL2 adjacent to each other in the second direction D2.

The bit and source BL and SL may alternate in a first direction D1. For example, the first bit lines BL1 and the first source lines SL1 may be alternately arranged in a first direction D1; and/or the second bit lines BL2 and the second source lines SL2 may be alternately arranged in the first direction D1.

The word line WL may be provided between corresponding first and second bit lines BL1 and BL2 (e.g., the first and second bit lines BL1 and BL2 adjacent to each other) and between corresponding first and second source lines SL1 and SL2 (e.g., the first and second source lines SL1 and SL2 adjacent to each other). The word line WL may horizontally extend in the first direction D1. A plurality of the word lines WL may be vertically stacked in the third direction D3.

The memory cell transistor MCT may be provided between a corresponding first source line SL and a first bit line BL (e.g., the first source line SL1 and the first bit line BL1, which are adjacent to each other). A source terminal of the memory cell transistor MCT may be connected to the first source line SL1, and a drain terminal of the memory cell transistor MCT may be connected to the first bit line BL1. A gate terminal of the memory cell transistor MCT may be connected to the word line WL. The memory cell transistor MCT may constitute a memory cell MEC. The memory cell MEC according to some embodiments of the inventive concepts may be a unit cell of a ferroelectric random access memory (FeRAM) device.

The memory cell transistor MCT may also be provided between a corresponding second source line SL2 and a second bit line BL2 (e.g., the second source line SL2 and the first bit line BL2, which are adjacent to each other). A source terminal of the memory cell transistor MCT may be connected to the second source line SL2, and a drain terminal of the memory cell transistor MCT may be connected to the second bit line BL2. A gate terminal of the memory cell transistor MCT may be connected to the word line WL.

A plurality of the memory cells MEC connected to the first source line SL1 and the first bit line BL1 may be stacked to constitute one cell string CSTR. A plurality of the memory cells MEC connected to the second source line SL2 and the second bit line BL2 may be stacked to constitute another cell string CSTR. The stacked word lines WL may be connected to the cell string CSTR.

The cell string CSTR may be a vertical string extending in the third direction D3. The cell string CSTR may include the stacked memory cells MEC (e.g., first, second and third memory cells MEC1, MEC2 and MEC3 sequentially stacked). In at least some embodiments, the first memory cell MEC1 connected to the first source line SL1 and the first bit line BL1 may be located at the same level as the first memory cell MEC1 connected to the second source line SL2 and the second bit line BL2. The first memory cell MEC1 connected to the first source line SL1 and the first bit line BL1 and the first memory cell MEC1 connected to the second source line SL2 and the second bit line BL2 may be connected in common to a single word line WL.

The cell string CSTR connected to the first source line SL1 and the first bit line BL1 may be provided in plurality along the first source and bit lines SL1 and BL1. The plurality of cell strings CSTR may be arranged in the first direction D1 along the word line WL. The cell string CSTR connected to the second source line SL2 and the second bit line BL2 may be provided in plurality along the second source and bit lines SL2 and BL2. The plurality of cell strings CSTR may be arranged in the first direction D1 along the word line WL.

As described above, the memory cells MEC according to the present embodiments may be three-dimensionally arranged. In other words, the memory device of FIG. 1 may be a 3D semiconductor memory device in which the memory cells MEC are three-dimensionally arranged.

In at least some embodiments, each of the memory cells MEC may be configured to store data using a polarization state of a ferroelectric material therein. The ferroelectric material in the memory cell MEC may be controlled to have one of a plurality of polarization states and/or may be configured to output an electrical signal corresponding to each of the polarization states. For example, the ferroelectric material in the memory cell MEC may store and/or output '1' or '0' as data having a logical state. For example, the ferroelectric material may be configured to switch between a first and second polarization state, wherein one of the polarization states inhibits charge carrier transfer in a channel layer and the other polarization state allows (or facilitates) charge carrier transfer in the channel layer.

The ferroelectric material may be polarized depending on control signals applied to the word line WL, the bit line BL and the source line SL. More particularly, voltages may be applied to the ferroelectric material through the word line WL, the bit line BL and the source line SL, and the polarization state of the ferroelectric material may be changed depending on a magnitude and direction of an electric field applied to the ferroelectric material. Data stored in the memory cell MEC may be read out by comparing a current outputted through the bit line BL with a reference current. For example, the polarization state of the ferroelectric material may be changed by applying, from the source or the drain direction, an electric field of greater magnitude than a polarization threshold. The polarization state of the ferroelectric material may be retained even when power is interrupted. In other words, the 3D semiconductor memory device according to the embodiments of the inventive concepts may be a non-volatile memory device.

Figure 2:
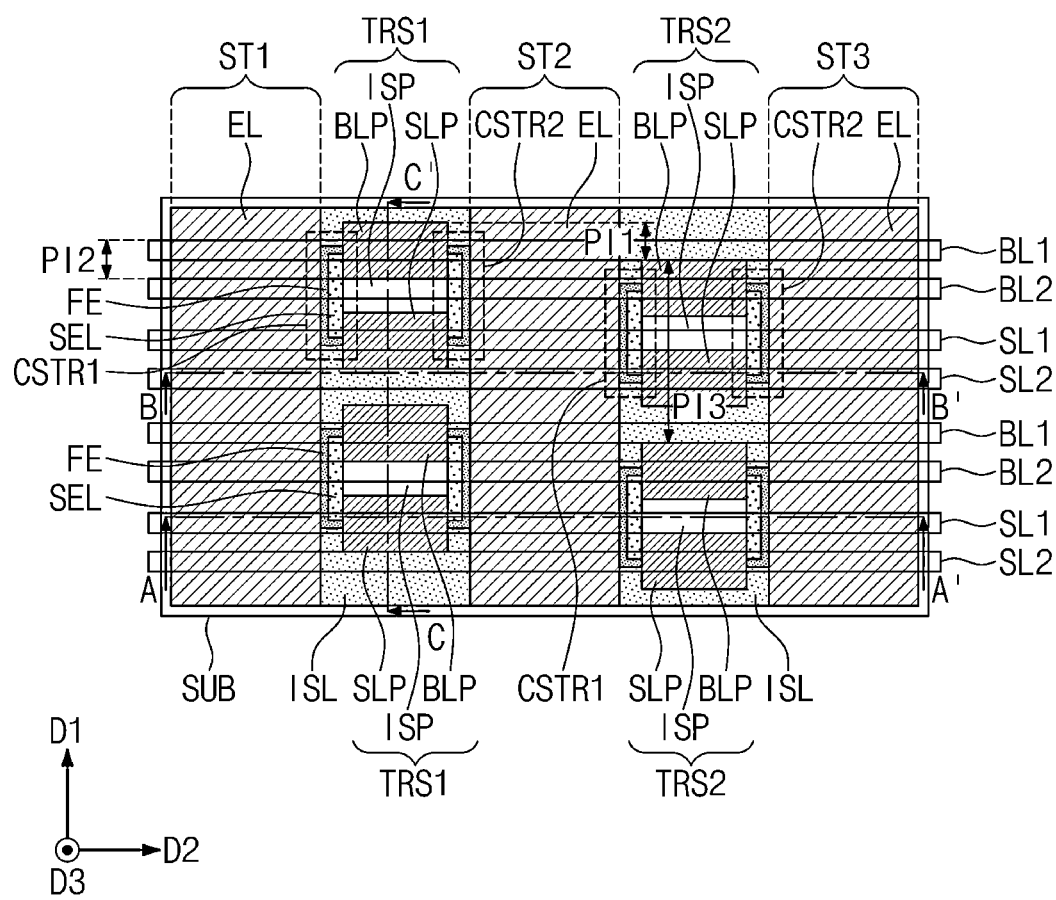
FIG. 2 is a plan view illustrating a 3D semiconductor memory device according to some embodiments of the inventive concepts.
Figure 3A:
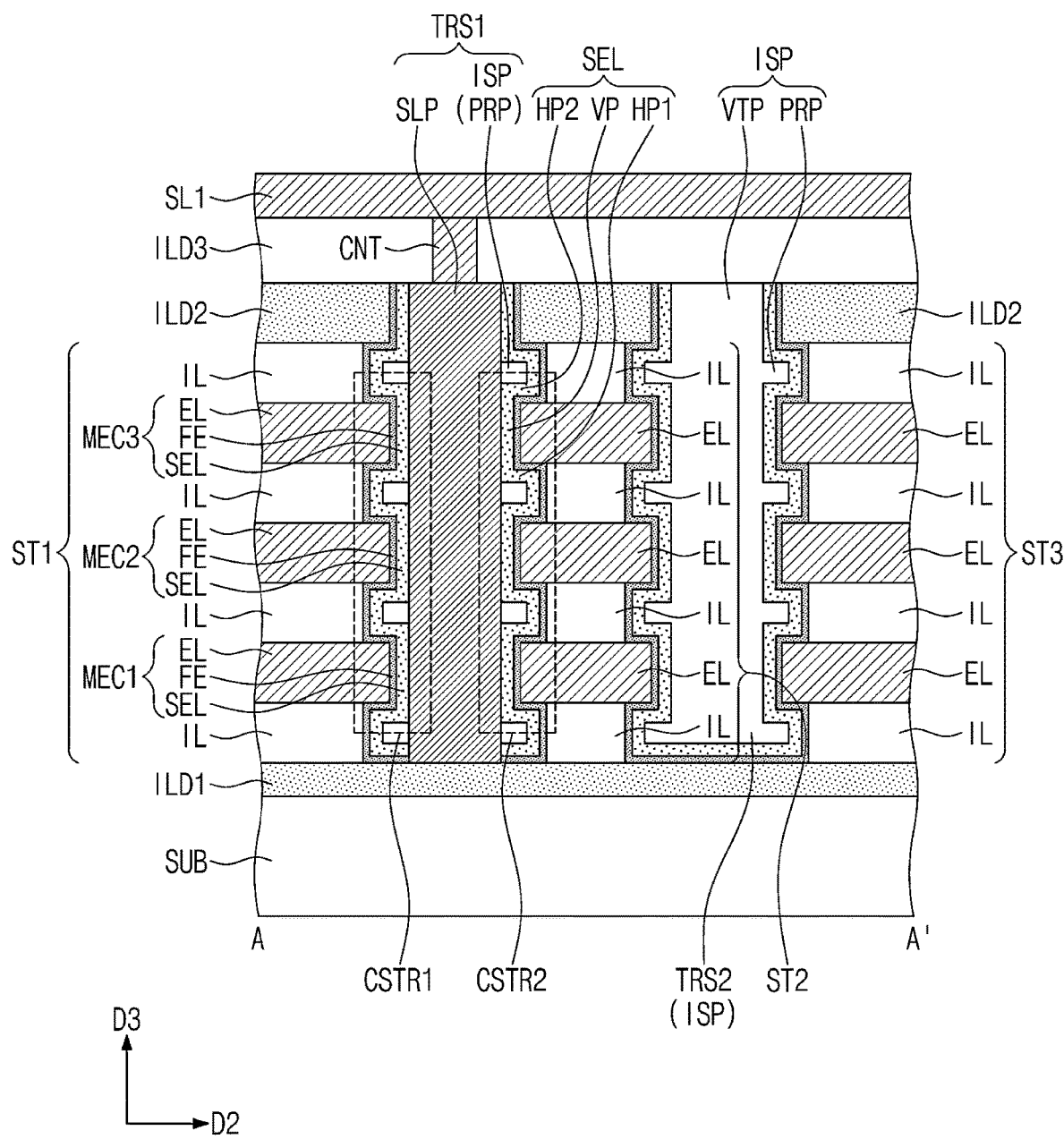
FIG. 3A is a cross-sectional view taken along a line A-A' of FIG. 2.
Figure 3B:
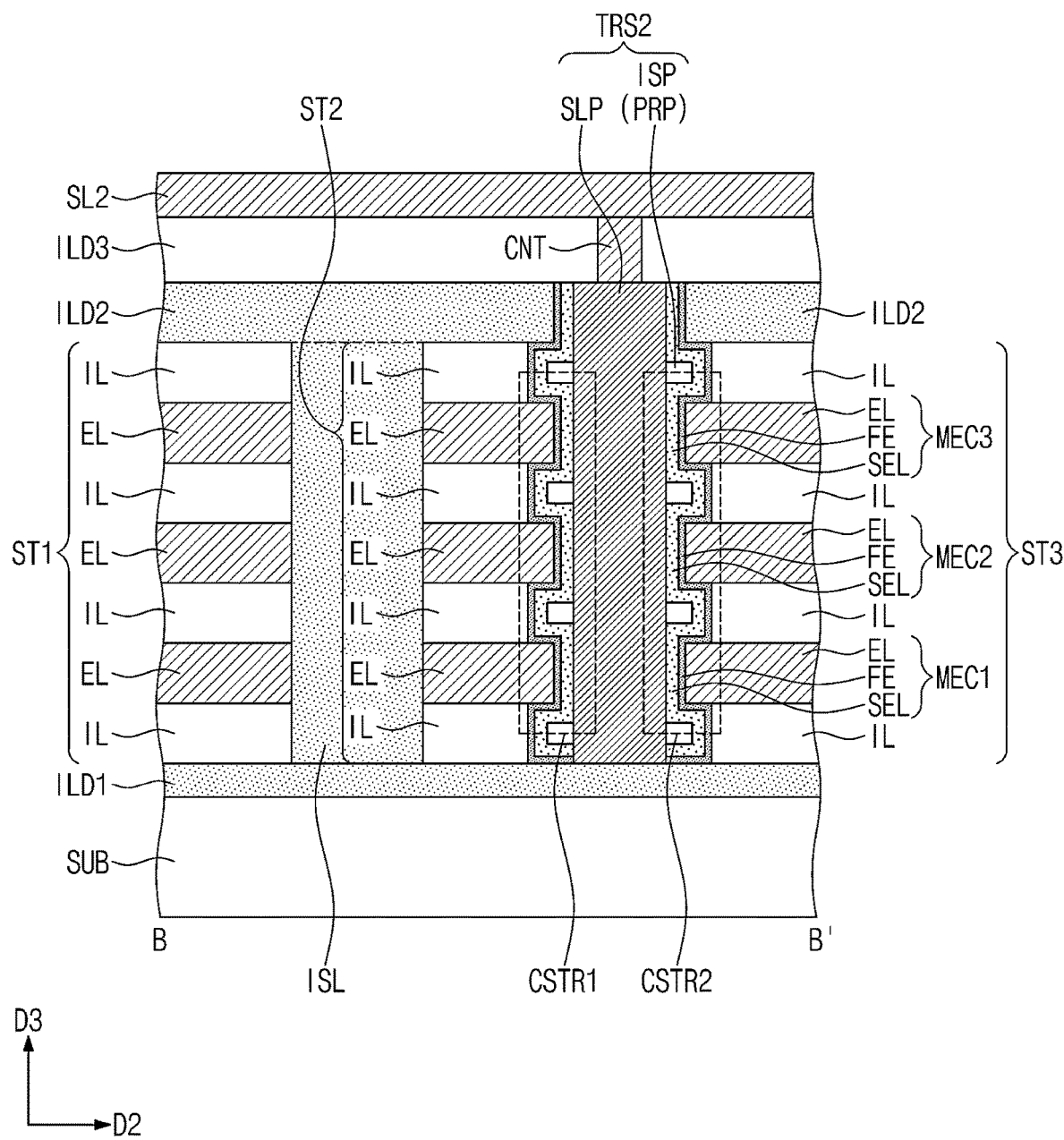
FIG. 3B is a cross-sectional view taken along a line B-B' of FIG. 2.
Figure 3C:
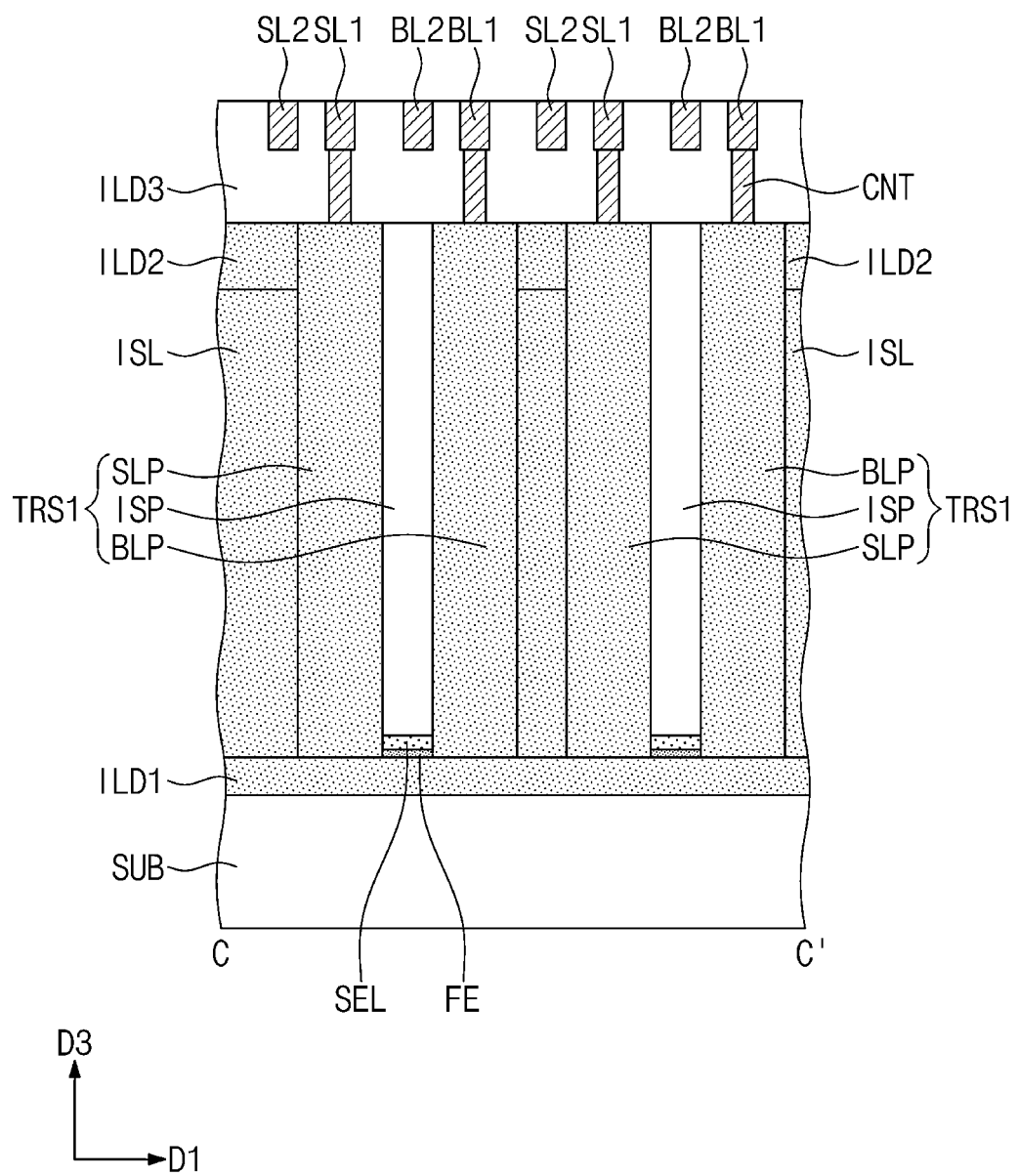
FIG. 3C is a cross-sectional view taken along a line C-C' of FIG. 2.
Figure 4:
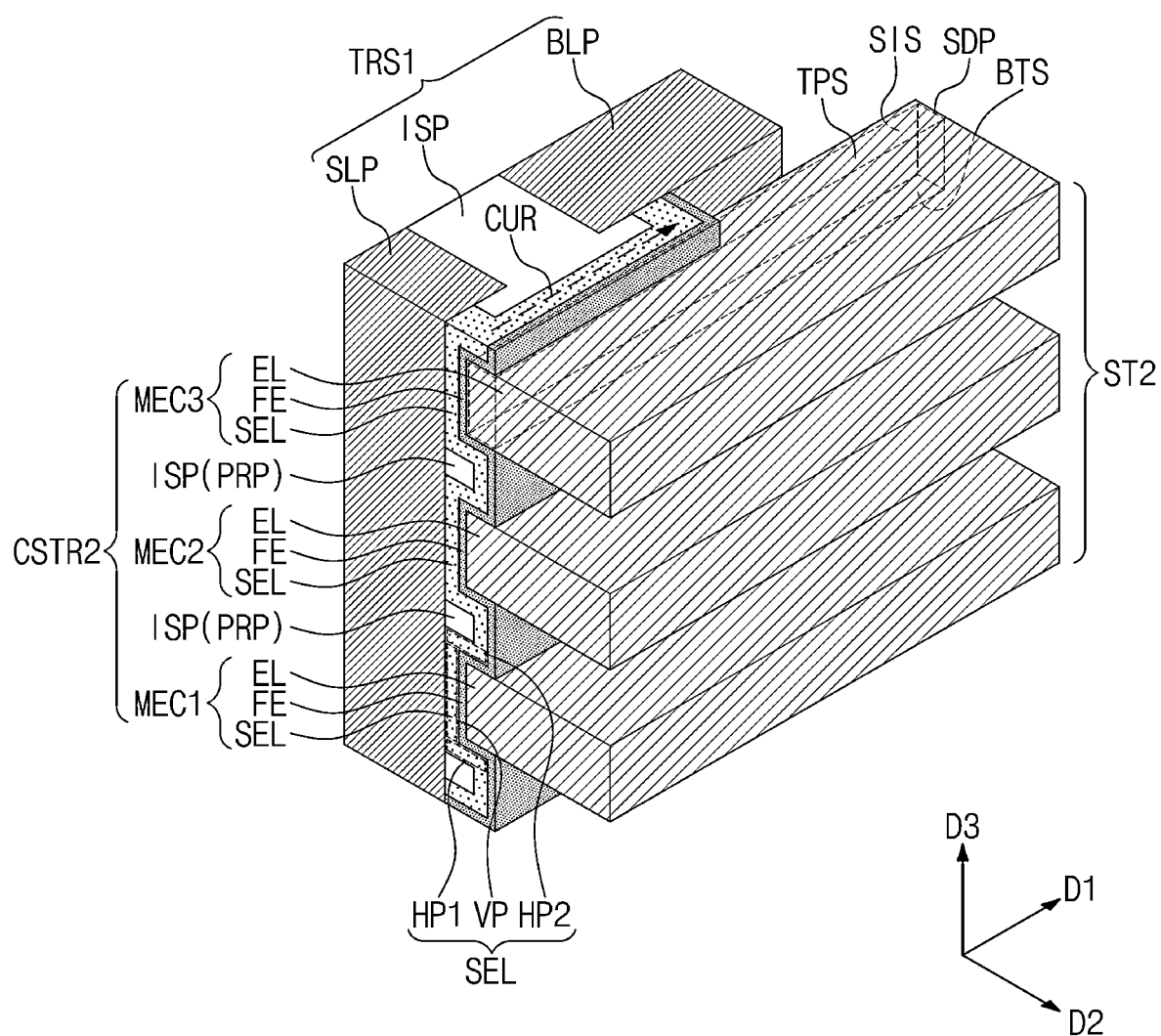
FIG. 4 is a perspective view illustrating a first cell string according to some embodiments of the inventive concepts.

FIG. 2 is a plan view illustrating a 3D semiconductor memory device according to some embodiments of the inventive concepts. FIG. 3A is a cross-sectional view taken along a line A-A' of FIG. 2. FIG. 3B is a cross-sectional view taken along a line B-B' of FIG. 2. FIG. 3C is a cross-sectional view taken along a line C-C' of FIG. 2. FIG. 4 is a perspective view illustrating a first cell string according to some embodiments of the inventive concepts.

Referring to FIGS. 2, 3A to 3C and 4, a first interlayer insulating layer ILD1 may be provided on a substrate SUB. First to third electrode structures ST1 to ST3 may be provided on the first interlayer insulating layer ILD1. The substrate SUB may be or include a semiconductor substrate and/or an insulating substrate. For example, the semiconductor substrate may include a silicon substrate, a silicon-germanium substrate, a germanium substrate, a single-crystalline epitaxial layer grown on a single-crystalline silicon substrate, and/or the like. For example, the insulating substrate may include a sapphire substrate, a glass substrate, a plastic substrate, and/or the like.

The first interlayer insulating layer ILD1 may be provided between the substrate SUB and the first to third electrode structures ST1 to ST3. The first interlayer insulating layer ILD1 may include a single insulating layer or stacked insulating layers. In at least one embodiment he stacked insulating layer may be different from each other. For example, the first interlayer insulating layer ILD1 may include at least one of a silicon oxide layer, a silicon nitride layer, and/or a silicon oxynitride layer.

The first to third electrode structures ST1 to ST3 may be spaced apart from each other in the second direction D2. Each of the first to third electrode structures ST1 to ST3 may have a line shape extending in the first direction D1 when viewed in a plan view. For example, each of the first to third electrode structures ST1 to ST3 may extend in the first direction D1. A line width of each of the first to third electrode structures ST1 to ST3 may be substantially uniform.

Each of the first to third electrode structures ST1 to ST3 may include a plurality of electrodes EL stacked and spaced apart from each other. An insulating layer IL may be disposed between the electrodes EL vertically adjacent to each other. For example, each of the first to third electrode structures ST1 to ST3 may include alternating stacks of electrodes EL and insulating layers IL. The stacked electrodes EL of the present embodiments may correspond to the stacked word lines WL of FIG. 1.

In at least some embodiments, the electrodes EL may include at least one of a doped semiconductor material (e.g., doped silicon, doped germanium, and/or the like), a conductive metal nitride (e.g., titanium nitride, tantalum nitride, and/or the like), a metal (e.g., tungsten, titanium, tantalum, and/or the like), a metal-semiconductor compound (e.g., tungsten silicide, cobalt silicide, titanium silicide, and/or the like), and/or the like. The insulating layers IL may include an insulator material such as at least one of silicon oxide, silicon nitride, silicon oxynitride, and/or the like.

First through-structures TRS1 may be provided between the first and second electrode structures ST1 and ST2. The first through-structures TRS1 may be arranged in the first direction D1. Each of the first through-structures TRS1 may include a first conductive pillar SLP, a second conductive pillar BLP, and an isolation insulating pattern ISP provided therebetween.

The first and second conductive pillars SLP and BLP may include at least one of a doped semiconductor material, a conductive metal nitride, a metal, a metal-semiconductor compound, and/or the like. The isolation insulating pattern ISP may include an insulating material such as at least one of silicon oxide, silicon nitride, silicon oxynitride, and/or the like.

The first and second conductive pillars SLP and BLP may have pillar shapes extending in the third direction D3. The first and second conductive pillars SLP and BLP may be spaced apart from each other in the first direction D1 with the isolation insulating pattern ISP interposed therebetween. The first and second conductive pillars SLP and BLP may be disposed between the electrode EL of the first electrode structure ST1 and the electrode EL of the second electrode structure ST2. In at least some embodiments, the first conductive pillar SLP may correspond to the first source line SL1 of FIG. 1 and the second conductive pillar BLP may correspond to the first bit line BL1 of FIG. 1.

The isolation insulating pattern ISP may include a pillar portion VTP electrically isolating the first and second conductive pillars SLP and BLP from each other, and a plurality of protrusions PRP horizontally protruding from the pillar portion VTP. The protrusions PRP may protrude into the insulating layers IL, respectively. In at least some embodiments, a width of the pillar portion VTP in the second direction D2 may be equal to or greater than a width of each of the first and second conductive pillars SLP and BLP in the second direction D2.

A channel layer SEL and a ferroelectric layer FE may be provided on a sidewall of the first through-structure TRS1. The channel layer SEL may extend in the third direction D3 along the sidewall of the first through-structure TRS1. For example, referring again to FIG. 3A, the channel layer SEL may extend in the third direction D3 while covering a sidewall of the first conductive pillar SLP and the protrusions PRP. The channel layer SEL may extend in the third direction D3 while covering a sidewall of the pillar portion VTP and the protrusions PRP of the isolation insulating pattern ISP. The ferroelectric layer FE may extend in the third direction D3 together along with the channel layer SEL.

In the plan view illustrated in FIG. 2, the channel layer SEL may have a line shape extending from the first conductive pillar SLP of the first through-structure TRS1 to the second conductive pillar BLP via the isolation insulating pattern ISP. The ferroelectric layer FE may be provided outside the channel layer SEL and may extend from the first conductive pillar SLP to the second conductive pillar BLP. Since the ferroelectric layer FE is provided outside the channel layer SEL, the ferroelectric layer FE may have a C-shape when viewed in a plan view. In other words, the ferroelectric layer FE may be in contact with three surfaces of the channel layer SEL when viewed in a plan view.

Second through-structures TRS2 may be provided between the second and third electrode structures ST2 and ST3. The second through-structures TRS2 may be arranged in the first direction D1. Each of the second through-structures TRS2 may include a first conductive pillar SLP, a second conductive pillar BLP, and an isolation insulating pattern ISP provided therebetween.

A channel layer SEL and a ferroelectric layer FE may be provided on a sidewall of the second through-structure TRS2. The first and second conductive pillars SLP and BLP and the isolation insulating pattern ISP of the second through-structure TRS2, the channel layer SEL and the ferroelectric layer FE may be substantially the same as described above.

The first through-structures TRS1 may be provided at a first side of the second electrode structure ST2, and the second through-structures TRS2 may be provided at a second side of the second electrode structure ST2. The first through-structures TRS1 arranged in the first direction D1 may correspond to the first bit and source lines BL1 and SL1 alternately arranged in the first direction D1, described above with reference to FIG. 1. The second through-structures TRS2 arranged in the first direction D1 may correspond to the second bit and source lines BL2 and SL2 alternately arranged in the first direction D1, described above with reference to FIG. 1. The stacked electrodes EL of the second electrode structure ST2 may correspond to the stacked word lines WL described above with reference to FIG. 1.

In at least some embodiments, the first through-structure TRS1 may not be aligned with the second through-structure TRS2 adjacent thereto in the second direction D2 but may be slightly offset from the second through-structure TRS2 in the first direction D1. This may be because the first through-structure TRS1 is connected to first bit and source lines BL1 and SL1 to be described later and the second through-structure TRS2 is connected to second bit and source lines BL2 and SL2 to be described later, and thus they TRS1 and TRS2 may be offset from each other in the first direction D1 by a pitch of interconnection lines.

First to third memory cells MEC1, MEC2 and MEC3 may be provided between the first through-structure TRS1 and the electrodes EL of the first electrode structure ST1, respectively. The first to third memory cells MEC1, MEC2 and MEC3 between the first electrode structure ST1 and the first through-structure TRS1 may be sequentially stacked to constitute a first cell string CSTR1.

First to third memory cells MEC1, MEC2 and MEC3 may be provided between the first through-structure TRS1 and the electrodes EL of the second electrode structure ST2, respectively. The first to third memory cells MEC1, MEC2 and MEC3 between the second electrode structure ST2 and the first through-structure TRS1 may be sequentially stacked to constitute a second cell string CSTR2.

The first cell string CSTR1 may be provided on a first side of the first through-structure TRS1, and the second cell string CSTR2 may be provided on a second side of the first through-structure TRS1. The first cell string CSTR1 and the second cell string CSTR2 may also be provided on both sides of the second through-structure TRS2, respectively.

Referring again to FIG. 4, each of the first to third memory cells MEC1, MEC2 and MEC3 (e.g., a unit cell) may include the electrode EL, the channel layer SEL, and the ferroelectric layer FE. The electrode EL, the channel layer SEL, and the ferroelectric layer FE of the unit cell may constitute the memory cell transistor MCT of FIG. 1. The memory cell transistor MCT of the present embodiments may include a thin film transistor. The unit cell of the present embodiments may be a 1-transistor (1T) memory cell.

The channel layer SEL may connect the first conductive pillar SLP and the second conductive pillar BLP to each other. In other words, the first and second conductive pillars SLP and BLP spaced apart from each other by the isolation insulating pattern ISP may be configured to be electrically connected to each other through the channel layer SEL. The channel layer SEL may form a body of the memory cell transistor. The channel layer SEL may include a source region connected to the first conductive pillar SLP, a drain region connected to the second conductive pillar BLP, and a channel region between the source and drain regions.

The channel layer SEL of the unit cell may include a first horizontal extension HP1, a second horizontal extension HP2, and a vertical extension VP connecting the first and second horizontal extensions HP1 and HP2 to each other. The channel layer SEL may surround a side SDP of the electrode EL. The first horizontal extension HP1 may be provided on a bottom surface BTS of the side SDP of the electrode EL. The second horizontal extension HP2 may be provided on a top surface TPS of the side SDP of the electrode EL. The vertical extension VP may be provided on a side surface SIS of the side SDP of the electrode EL. In other words, the channel layer SEL of the unit cell may have a C-shape and may cover the three surfaces TPS, SIS and BTS of the electrode EL. A thickness of the channel layer SEL may be greater than a thickness of the ferroelectric layer FE. For example, the thickness of the ferroelectric layer FE may range from 5 nm to 20 nm.

The channel layer SEL may include at least one of a semiconductor material, an amorphous oxide semiconductor, a two-dimensional material, and/or the like. In some embodiments, the channel layer SEL may include at least one of polysilicon, doped silicon (Si), silicon-germanium (SiGe), a semiconductor material formed by a selective epitaxial growth (SEG) process, and/or the like.

In certain embodiments, the channel layer SEL may include the amorphous oxide semiconductor. For example, the channel layer SEL may include a compound of oxygen (O) and at least two of zinc (Zn), indium (In), gallium (Ga), or tin (Sn). For example, the channel layer SEL may include at least one of indium gallium zinc oxide (IGZO), indium tin zinc oxide (ITZO), Sn-IGZO, IWO, $CuS_2$, $CuSe_2$, $WSe_2$, IZO, ZTO, YZO, and/or the like In certain embodiments, the channel layer SEL may include the two-dimensional material. For example, the channel layer SEL may include a metal chalcogenide, a transition metal chalcogenide, graphene, phosphorene, and/or the like. The metal chalcogenide or transition metal chalcogenide may be a metal compound represented by a chemical formula of MXy (where 'y' is an integral number of, for example, 1, 2 or 3). In the chemical formula, 'M' may be a metal and/or transition metal atom such as W, Mo, Ti, Zn, Zr, and/or the like. 'X' may be a chalcogen atom such as S, Se, O, Te, and/or the like. For example, the channel layer SEL may include at least one of graphene, phosphorene, $MoS_2$, $MoSe_2$, $MoTe_2$, $WS_2$, $WSe_2$, $WTe_2$, $ReS_2$, $ReSe_2$, $TiS_2$, $TiSe_2$, $TiTe_2$, ZnO, $ZnS_2$, $WO_3$, $MoO_3$, and/or the like. The channel layer SEL may have a monolayer or a multi-layer in which 2 to 100 monolayers are stacked. The multi-layer may have a structure in which a monolayer is combined with another monolayer adjacent thereto by van der Waals force.

The ferroelectric layer FE may be disposed between the channel layer SEL and the electrode EL. The ferroelectric layer FE may be conformally formed along a profile of the channel layer SEL. The ferroelectric layer FE may be configured to have one of various polarization states depending on a voltage applied between the electrode EL and the first and second conductive pillars SLP and BLP.

The ferroelectric layer FE may include a ferroelectric material. In some embodiments, the ferroelectric layer FE may include a Hf compound (e.g., a Hf-based oxide) having ferroelectric properties. In at least some embodiments, the Hf-based oxide having the ferroelectric properties may further include a dopant such as at least one impurity selected from a group consisting of Zr, Si, Al, Y, Gd, La, Sc, and Sr. For example, the ferroelectric layer FE may include $HfO_2$, HfZnO, HfSiO, HfSiON, HfTaO, HfTiO, HfZrO, a combination thereof, and/or the like. The ferroelectric layer FE may have a non-centrosymmetric phase (such as an orthorhombic phase) which has at least two stable states in each unit cell, which can be switched by an external electrical force (or field). The ferroelectric layer FE may include a single ferroelectric layer, a multi-layer in which two or more kinds of ferroelectric layers are stacked, or a multi-layer in which a ferroelectric layer and a dielectric layer are stacked.

A current CUR may flow from the first conductive pillar SLP to the second conductive pillar BLP through the channel layer SEL. The current CUR may flow through the first horizontal extension HP1, the second horizontal extension HP2 and the vertical extension VP of the channel layer SEL. In other words, in the memory cell transistor MCT of the present embodiments, carriers may move through a channel having a three-dimensional shape (e.g., the three-dimensional C-shaped channel layer SEL).

The protrusion PRP of the isolation insulating pattern ISP may be provided between the memory cells MEC adjacent to each other. For example, the channel layer SEL of the second memory cell MEC2 may be node-isolated from the channel layer SEL of the third memory cell MEC3 by the protrusion PRP of the isolation insulating pattern ISP. In other words, the channel layer SEL of the second memory cell MEC2 and the channel layer SEL of the third memory cell MEC3 may be physically connected to each other but may be operated independently of each other by the protrusion PRP of the isolation insulating pattern ISP.

Referring again to FIGS. 2 and 3A to 3C, an isolation insulating layer ISL may be provided between the first through-structures TRS1 adjacent to each other. The isolation insulating layer ISL may insulate (or isolate) the first through-structure TRS1 from an adjacent first through-structure TRS1 in such a way that the first through-structures TRS1 are controlled independently of each other. The isolation insulating layer ISL may isolate the first and second cell strings CSTR1 and CSTR2 at both sides of the first through-structure TRS1 from the first and second cell strings CSTR1 and CSTR2 at both sides of the adjacent first through-structure TRS1. The isolation insulating layer ISL may also be provided between the second through-structures TRS2 adjacent to each other.

In some embodiments, a first portion of a sidewall of the first conductive pillar SLP may be in contact with the channel layer SEL and the ferroelectric layer FE. A second portion (e.g., a remaining portion) of the sidewall of the first conductive pillar SLP may be in contact with the isolation insulating layer ISL. A first portion of a sidewall of the second conductive pillar BLP may be in contact with the channel layer SEL and the ferroelectric layer FE. A second portion (e.g., a remaining portion) of the sidewall of the second conductive pillar BLP may be in contact with the isolation insulating layer ISL.

A second interlayer insulating layer ILD2 may be provided on the first to third electrode structures ST1 to ST3. The second interlayer insulating layer ILD2 may be connected to the isolation insulating layer ISL. In some embodiments, the second interlayer insulating layer ILD2 and the isolation insulating layer ISL may include the same insulating material. For example, the second interlayer insulating layer ILD2 and the isolation insulating layer ISL may be a single insulating layer.

In some embodiments of the inventive concepts, top surfaces of the first through-structures TRS1 may be coplanar with a top surface of the second interlayer insulating layer ILD2. Top surfaces of the second through-structures TRS2 may be coplanar with the top surface of the second interlayer insulating layer ILD2. A topmost surface of the channel layer SEL and a topmost surface of the ferroelectric layer FE may be coplanar with the top surface of the second interlayer insulating layer ILD2.

A third interlayer insulating layer ILD3 may be provided on the second interlayer insulating layer ILD2. A plurality of interconnection lines extending in parallel in the second direction D2 may be provided in an upper portion of the third interlayer insulating layer ILD3. The plurality of interconnection lines may include first and second bit lines BL1 and BL2 and first and second source lines SL1 and SL2.

The first source line SL1 and the second source line SL2 may be adjacent to each other in the first direction D1. The first source line SL1 may be electrically connected to the first conductive pillar SLP of the first through-structure TRS1. The second source line SL2 may be electrically connected to the first conductive pillar SLP of the second through-structure TRS2.

The first bit line BL1 and the second bit line BL2 may be adjacent to each other in the first direction D1. The first bit line BL1 may be electrically connected to the second conductive pillar BLP of the first through-structure TRS1.

The second bit line BL2 may be electrically connected to the second conductive pillar BLP of the second through-structure TRS2.

The first and second source lines SL1 and SL2 may be connected to the first conductive pillars SLP through contacts CNT, respectively. The first and second bit lines BL1 and BL2 may be connected to the second conductive pillars BLP through contacts CNT, respectively In some embodiments, the first through-structure TRS1 may be offset from the second through-structure TRS2 adjacent thereto in the first direction D1 by a first pitch PI1. A pitch between the first and second source lines SL1 and SL2 adjacent to each other may be a second pitch PI2. A pitch between the first and second bit lines BL1 and BL2 adjacent to each other may be the second pitch PI2. Here, the first pitch PI1 may be substantially equal to the second pitch PI2. For example, a pitch of the second through-structures TRS2 in the first direction D1 may be a third pitch PI3. The first pitch PI1 may be less than a half (e.g., less than PI3/2) of the third pitch PI3.

The second cell string CSTR2 between the second electrode structure ST2 and the first through-structure TRS1 may be offset from the first cell string CSTR1 between the second electrode structure ST2 and the second through-structure TRS2 in the first direction D1 by the first pitch PI1. For example, the first and second cell strings CSTR1 and CSTR2 at both sides of the electrode EL may be slightly offset from each other in the first direction D1.

The 3D semiconductor memory device according to the present embodiments may have a three-dimensional thin film transistor structure in which the channel layer SEL three-dimensionally surrounds the side SDP of the electrode EL. Thus, on-current (e.g., CUR) properties of the memory cell transistor may be improved. In the 3D semiconductor memory device according to the present embodiments, the electrode EL extending in the first direction D1 may have the line shape without a change in line width and may connect the cell strings arranged in the first direction D1. In other words, the electrode EL may be formed to have a uniform and great line width, and thus a resistance of the electrode EL may be reduced. As a result, electrical characteristics of the 3D semiconductor memory device may be improved.

Figure 10A:
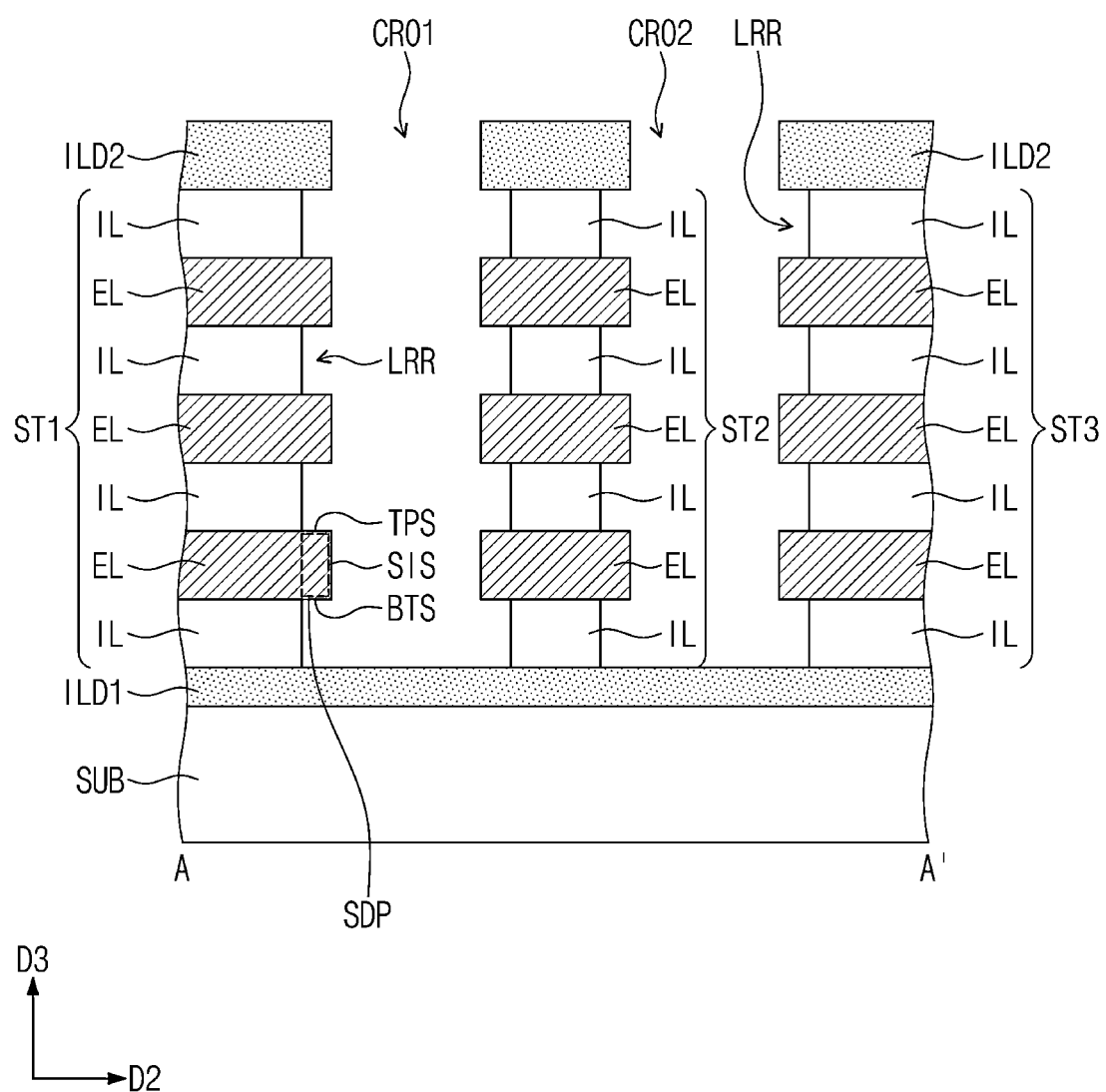
Figure 10B:
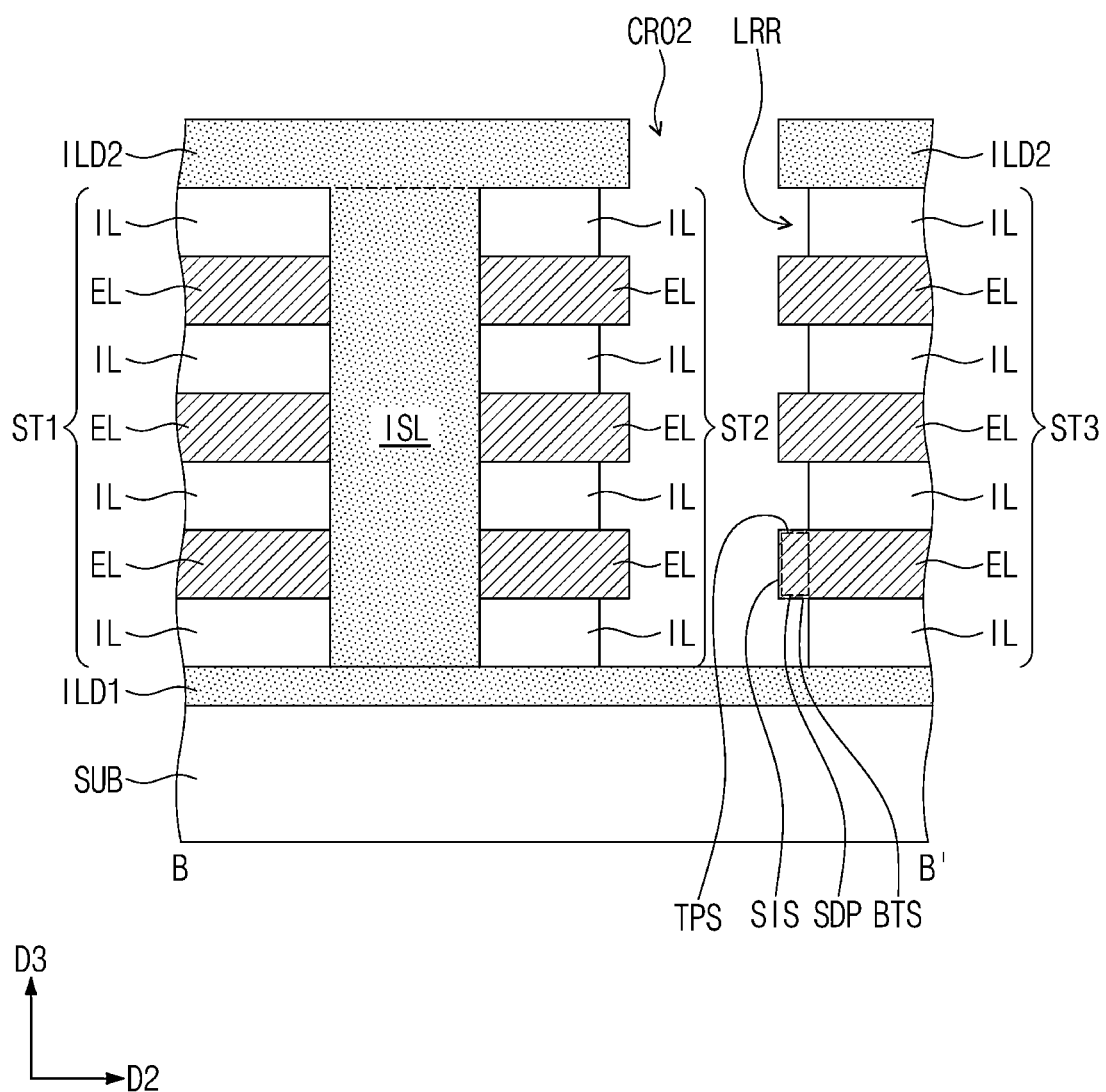
Figure 10C:
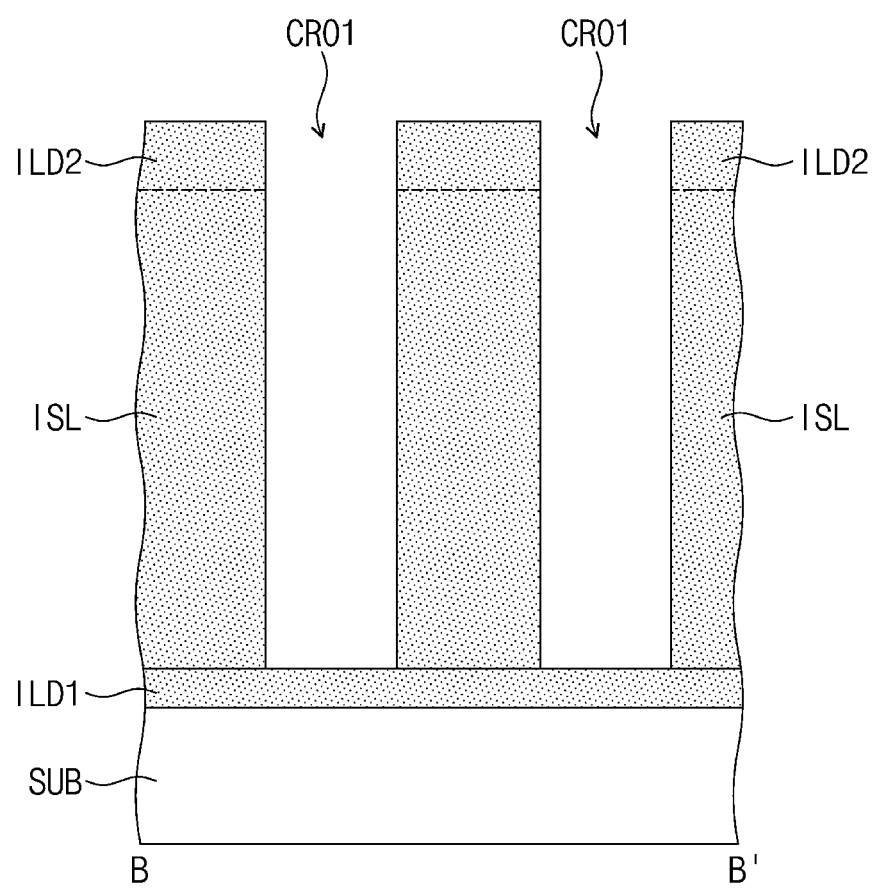
FIGS. 10C, 12C and 14C are cross-sectional views taken along lines C-C' of FIGS. 9, 11 and 13, respectively.
Figure 11:
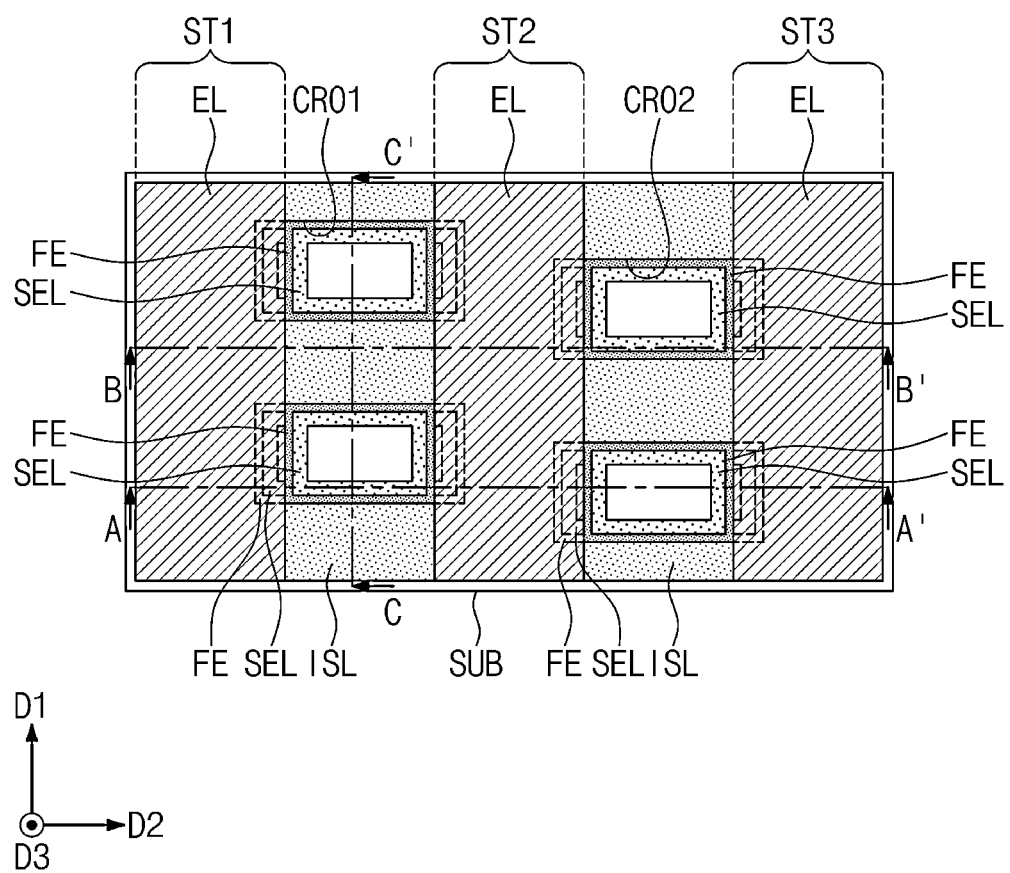
Figure 12A:
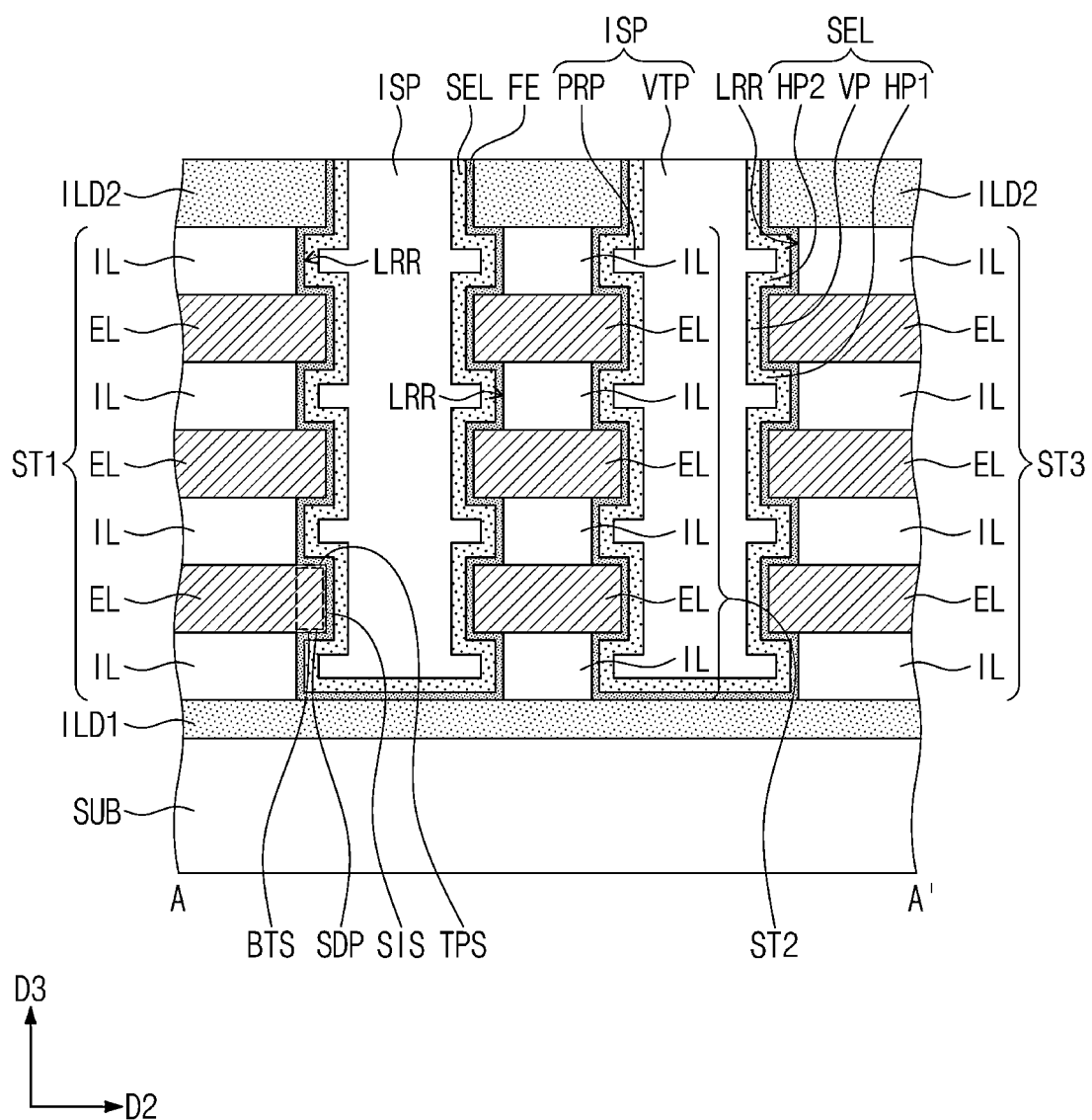
Figure 12B:
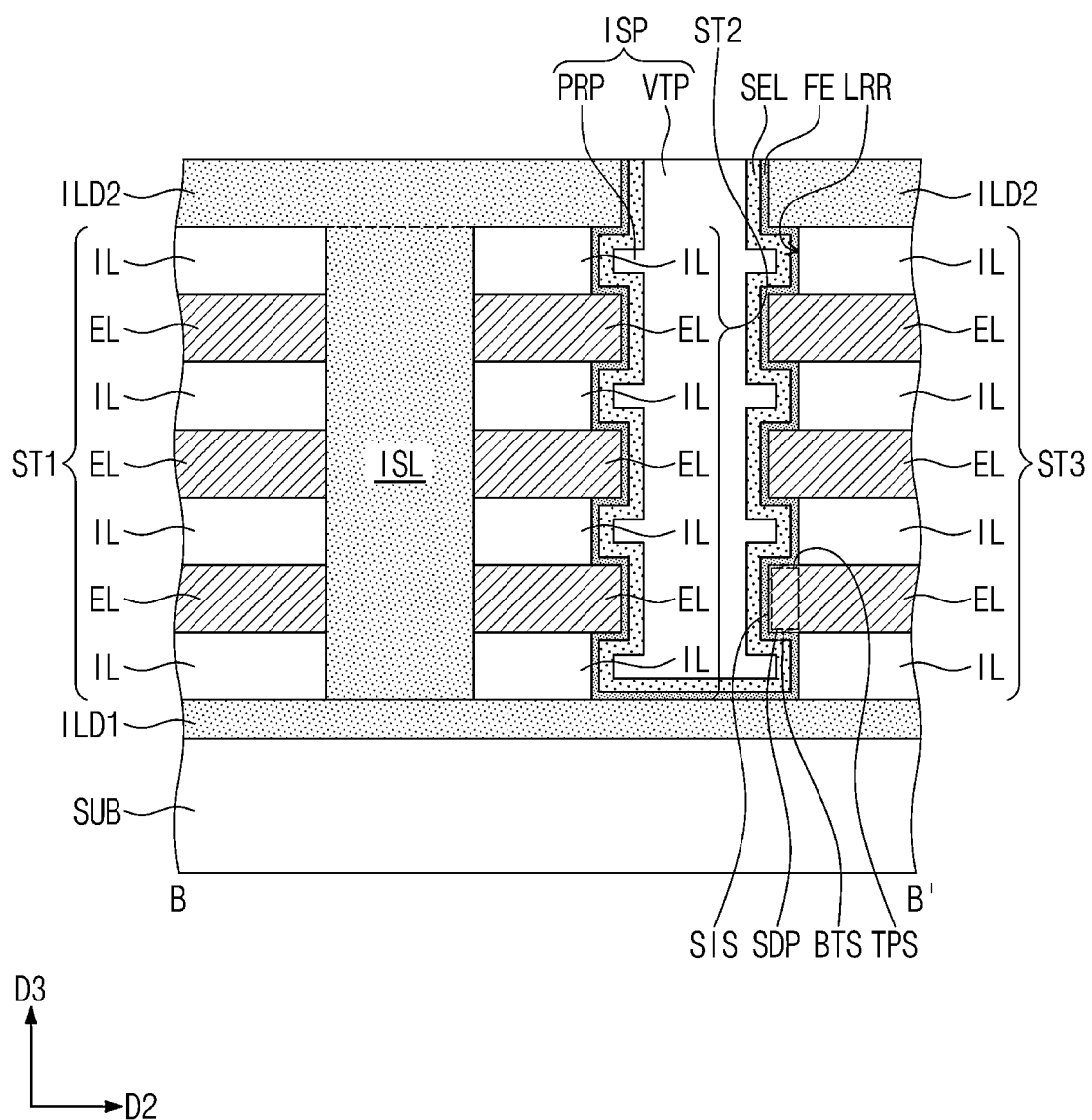
Figure 12C:
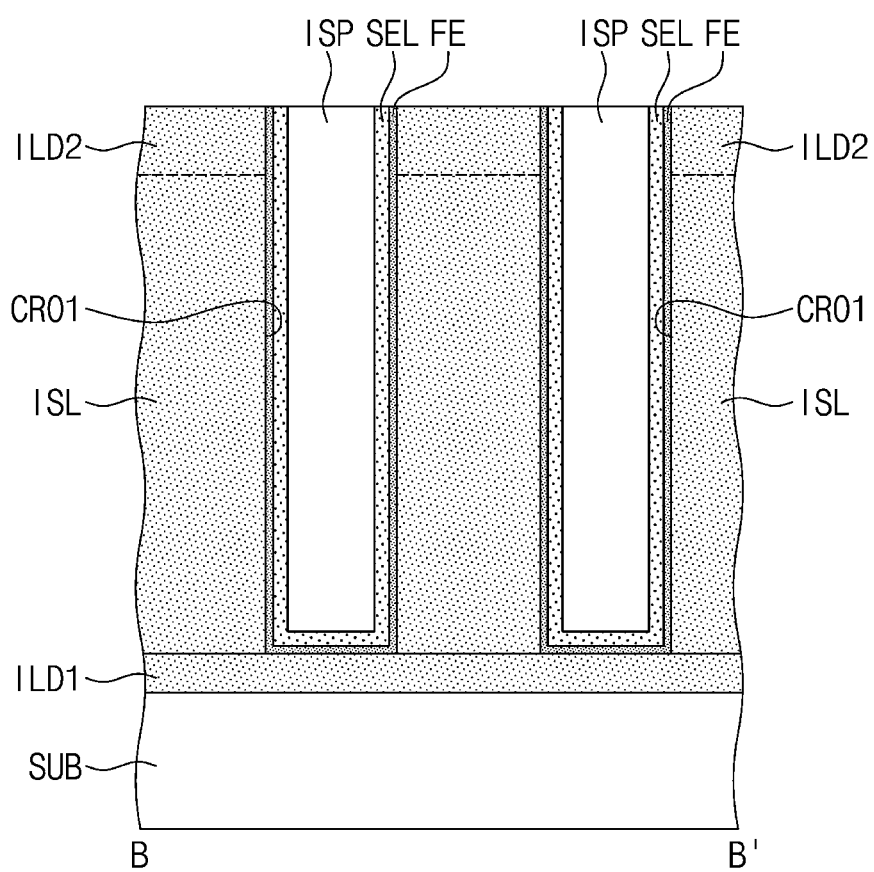
Figure 13:
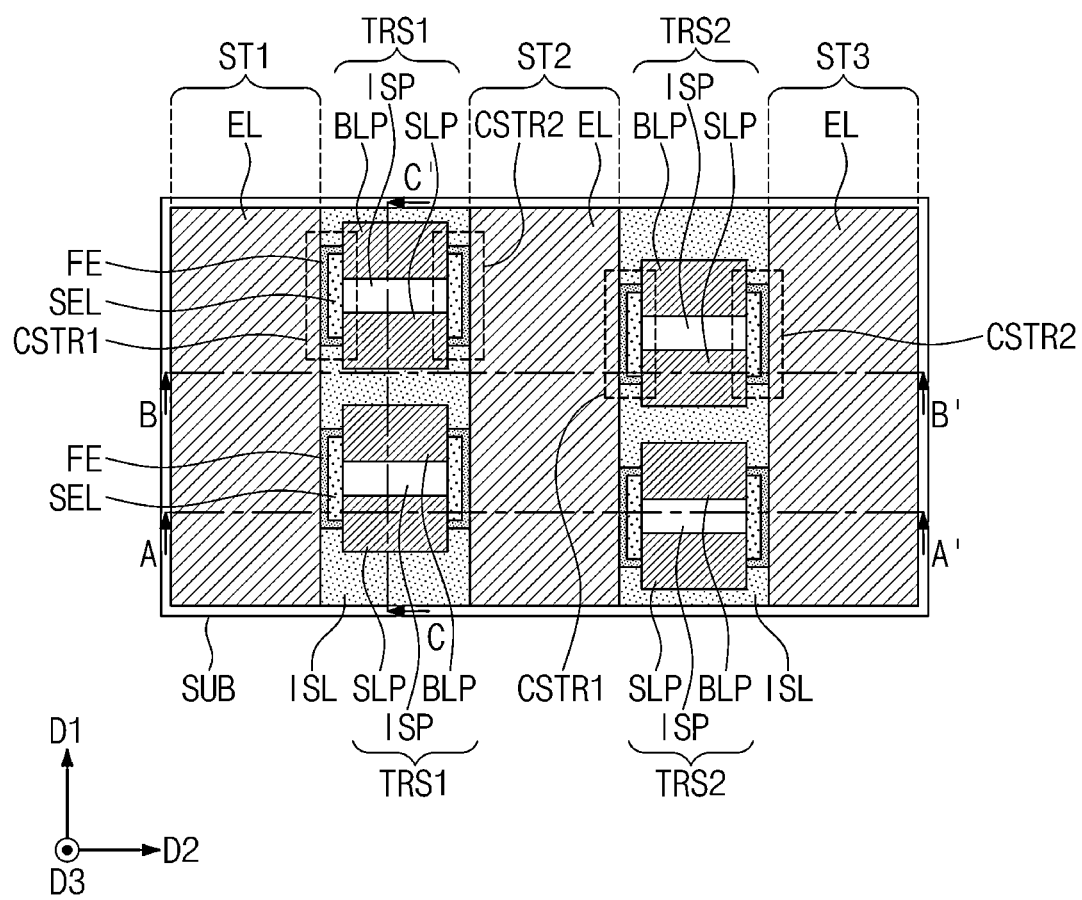
Figure 14A:
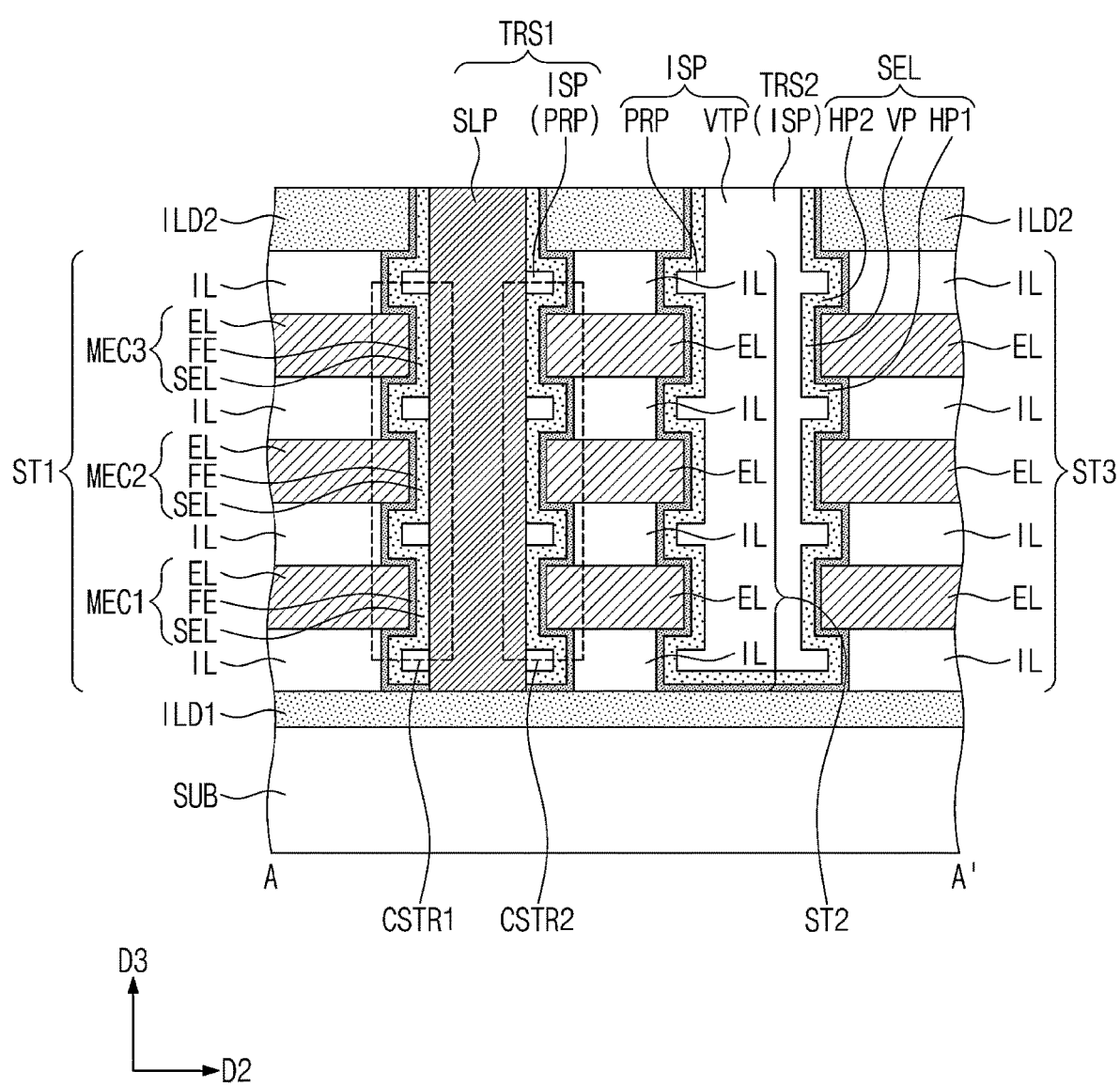
Figure 14B:
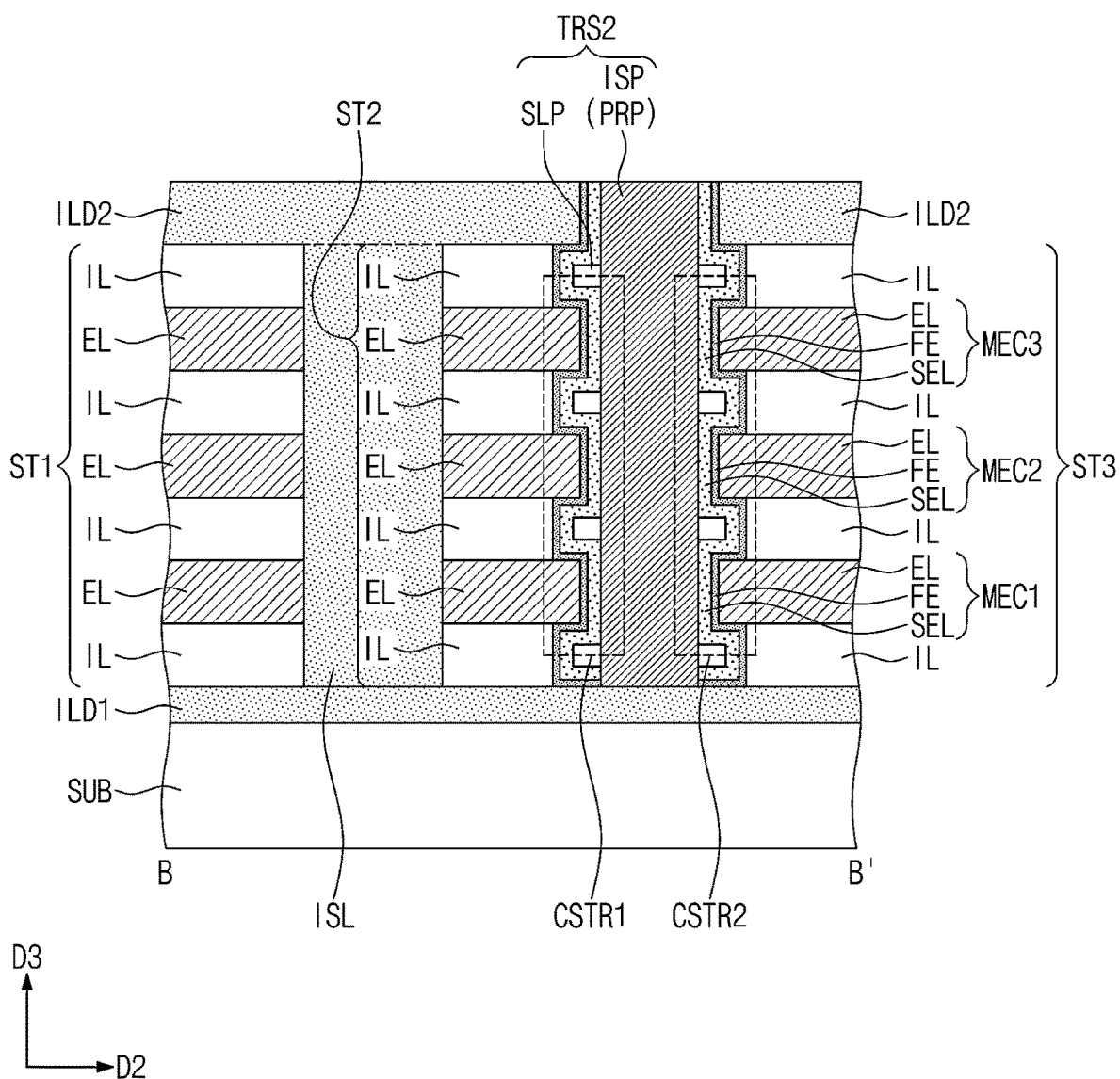
Figure 14C:
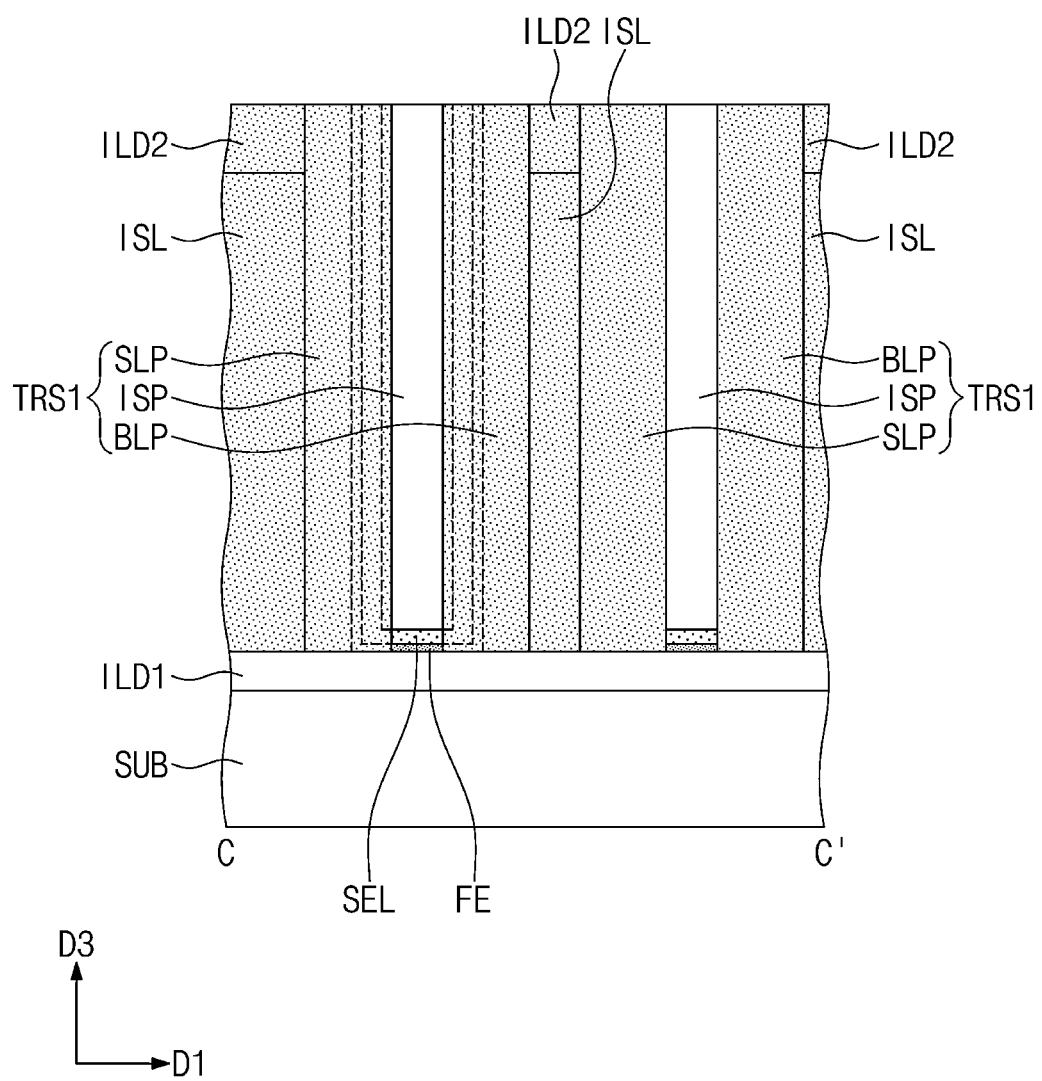

FIGS. 5, 7, 9, 11 and 13 are plan views illustrating a method of manufacturing a 3D semiconductor memory device according to some embodiments of the inventive concepts. FIGS. 6, 8A, 10A, 12A and 14A are cross-sectional views taken along lines A-A' of FIGS. 5, 7, 9, 11 and 13, respectively. FIGS. 8B, 10B, 12B and 14B are cross-sectional views taken along lines B-B' of FIGS. 7, 9, 11 and 13, respectively. FIGS. 10C, 12C and 14C are cross-sectional views taken along lines C-C' of FIGS. 9, 11 and 13, respectively.

Figure 5:
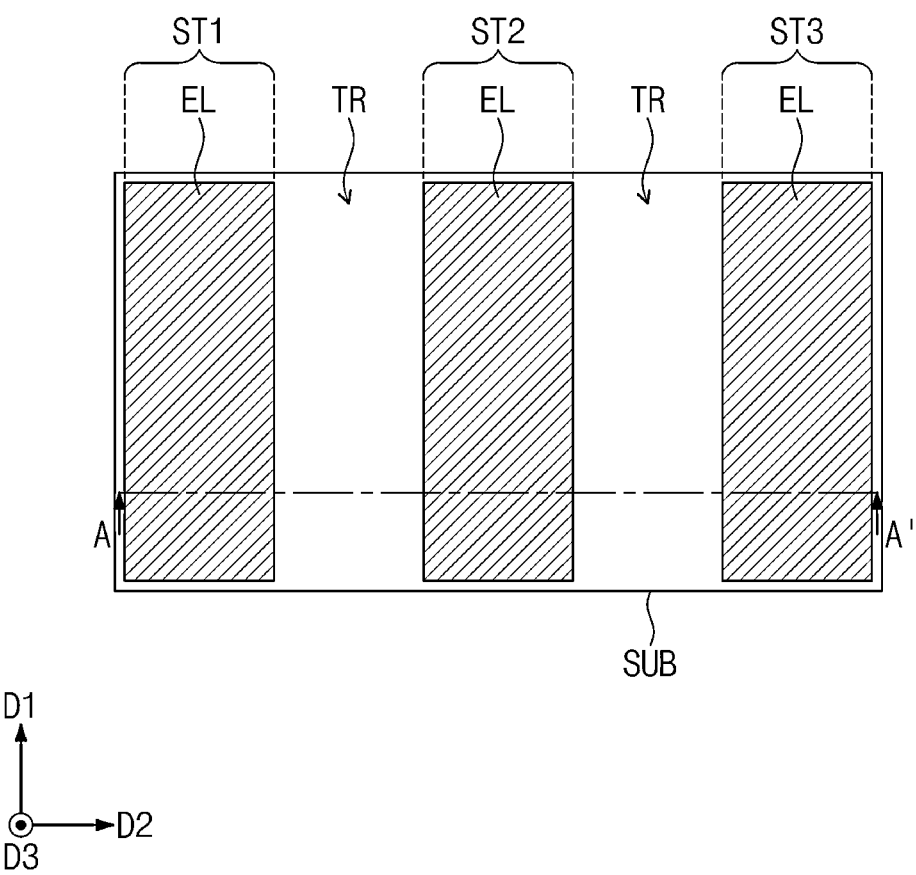
FIGS. 5, 7, 9, 11 and 13 are plan views illustrating a method of manufacturing a 3D semiconductor memory device according to some embodiments of the inventive concepts.
Figure 6:
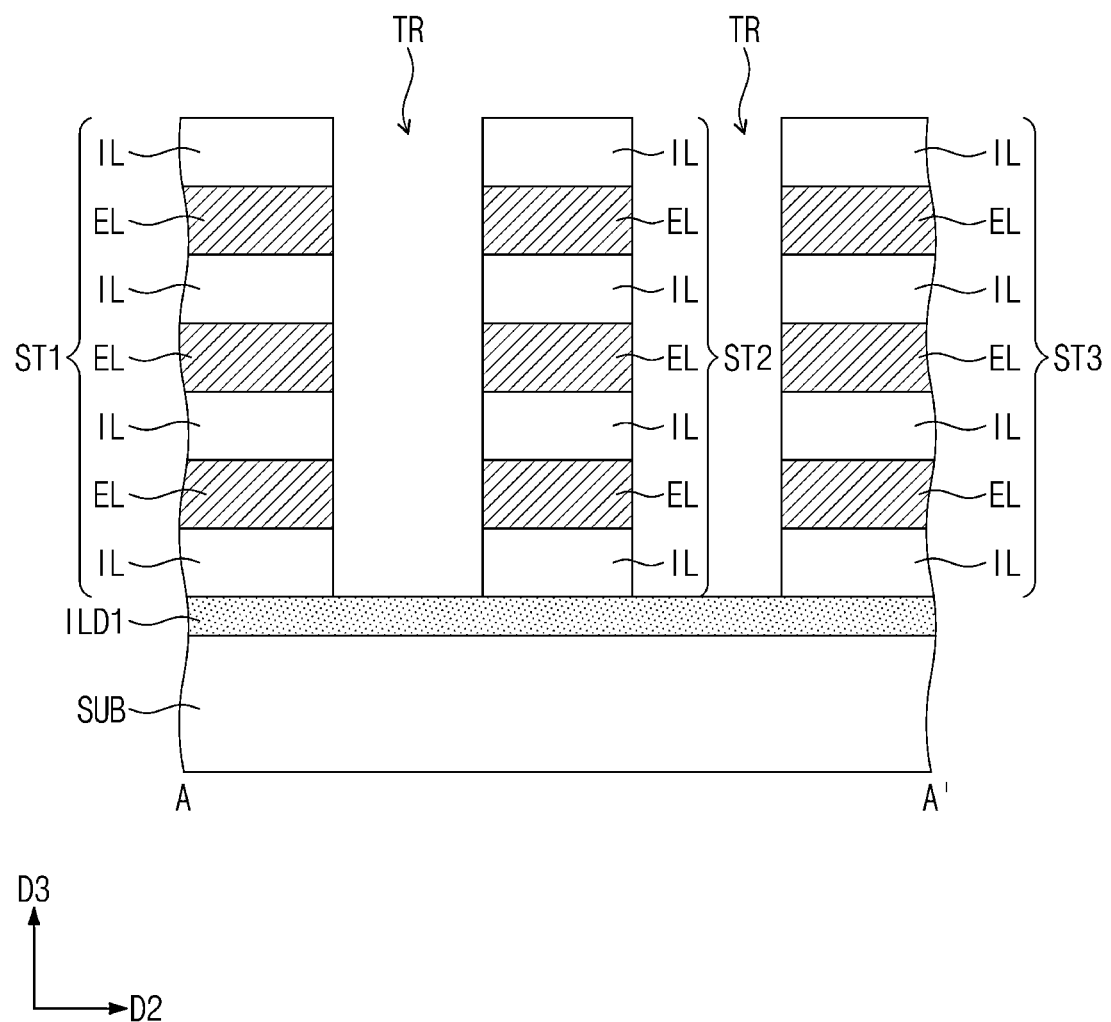
FIGS. 6, 8A, 10A, 12A and 14A are cross-sectional views taken along lines A-A' of FIGS. 5, 7, 9, 11 and 13, respectively.

Referring to FIGS. 5 and 6, a first interlayer insulating layer ILD1 may be formed on a substrate SUB. The first interlayer insulating layer ILD1 may function as an etch stop layer. The first interlayer insulating layer ILD1 may include at least one of a silicon oxide layer, a silicon nitride layer, a silicon oxynitride layer, and/or the like.

An electrode structure ST may be formed on the first interlayer insulating layer ILD1. The formation of the electrode structure ST may include alternately stacking insulating layers IL and electrodes EL on the first interlayer insulating layer ILD1. In at least some embodiments, the insulating layers IL may be formed of a silicon (Si)-based insulating material, and the electrodes EL may be formed of at least one of a doped semiconductor material, a metal, a conductive metal nitride, a metal-semiconductor compound, and/or the like.

The electrode structure ST may be patterned to form a plurality of electrode structures ST1 to ST3 extending in the first direction D1. The plurality of electrode structures ST1 to ST3 may include first to third electrode structures ST1, ST2 and ST3 sequentially arranged in the second direction D2.

The formation of the first to third electrode structures ST1, ST2 and ST3 may include anisotropically etching the electrode structure ST to form trenches TR penetrating the electrode structure ST. The trenches TR may have line shapes extending in the first direction D1. The trenches TR may expose the first interlayer insulating layer ILD1. For example, the first interlayer insulating layer ILD1 may be used as an etch stop layer of the anisotropic etching process.

The first and second electrode structures ST1 and ST2 may be spaced apart from each other in the second direction D2 with the trench TR interposed therebetween. The second and third electrode structures ST2 and ST3 may be spaced apart from each other in the second direction D2 with the trench TR interposed therebetween.

Figure 7:
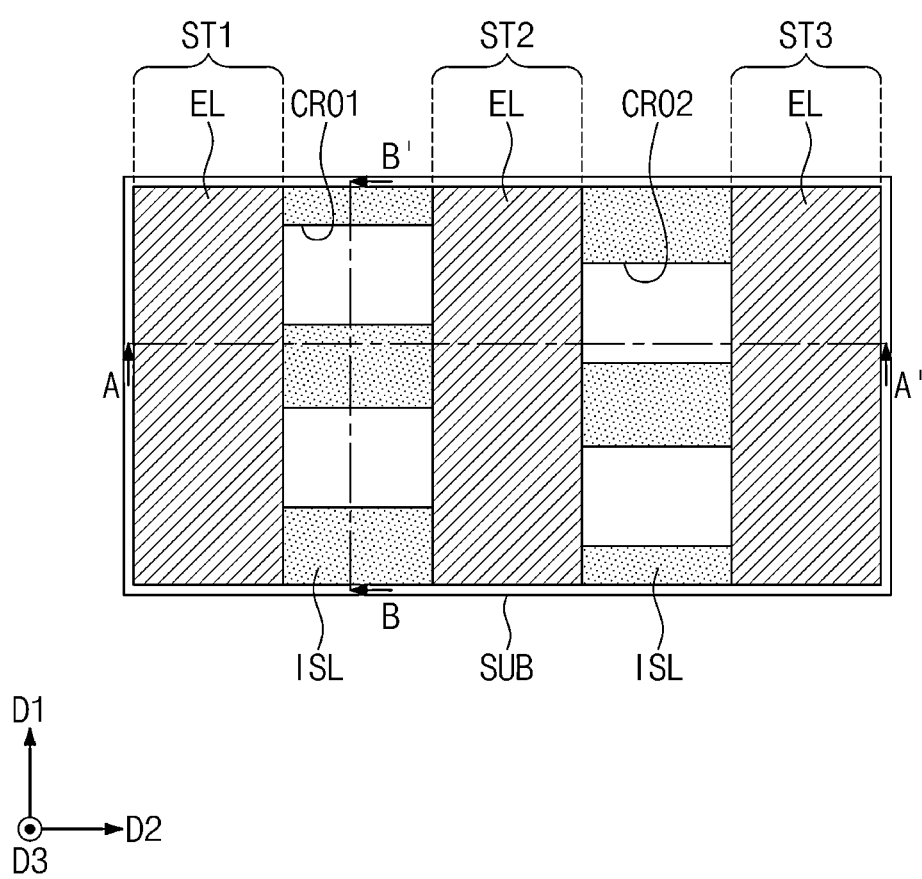
Figure 8A:
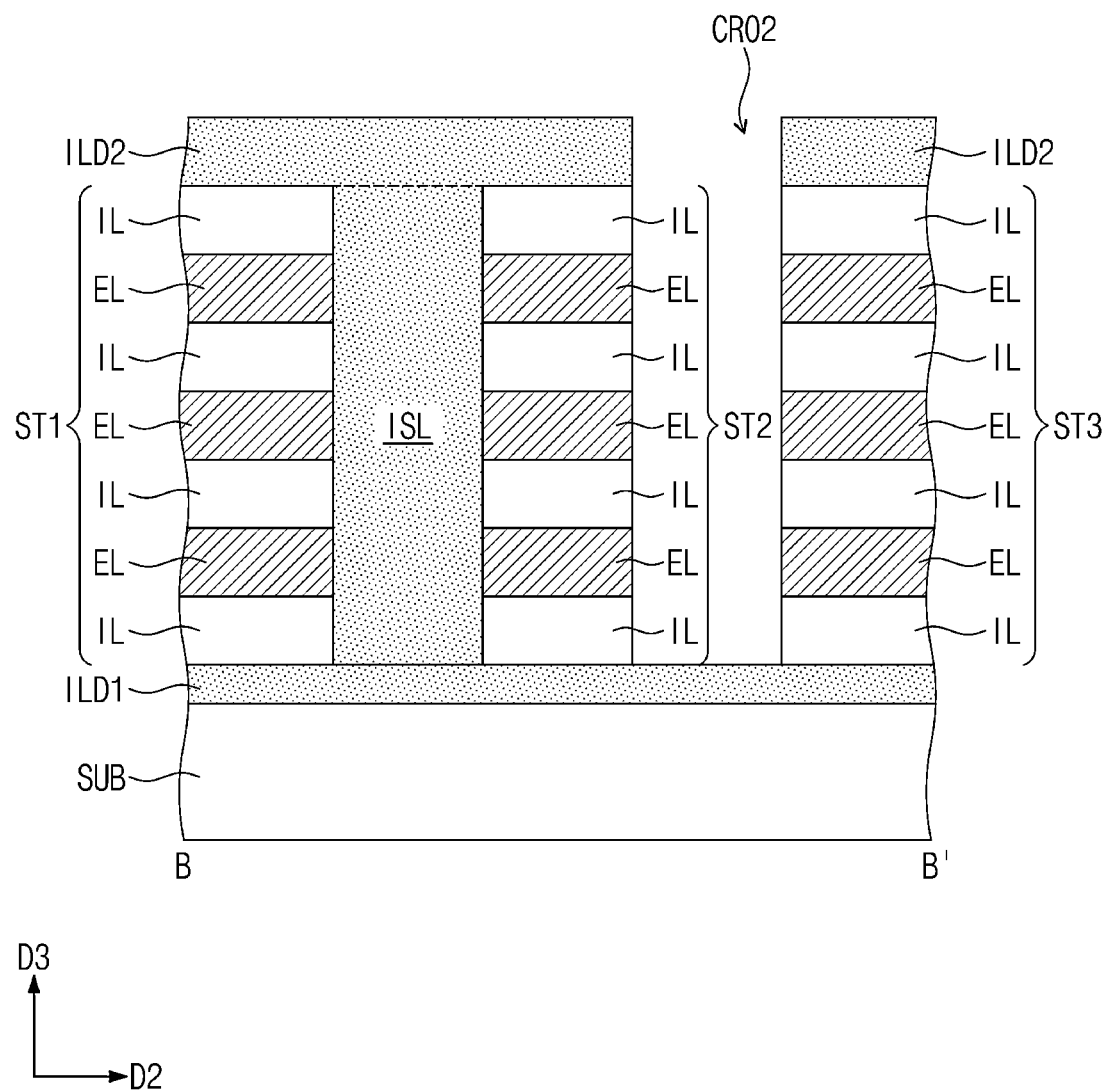
Figure 8B:
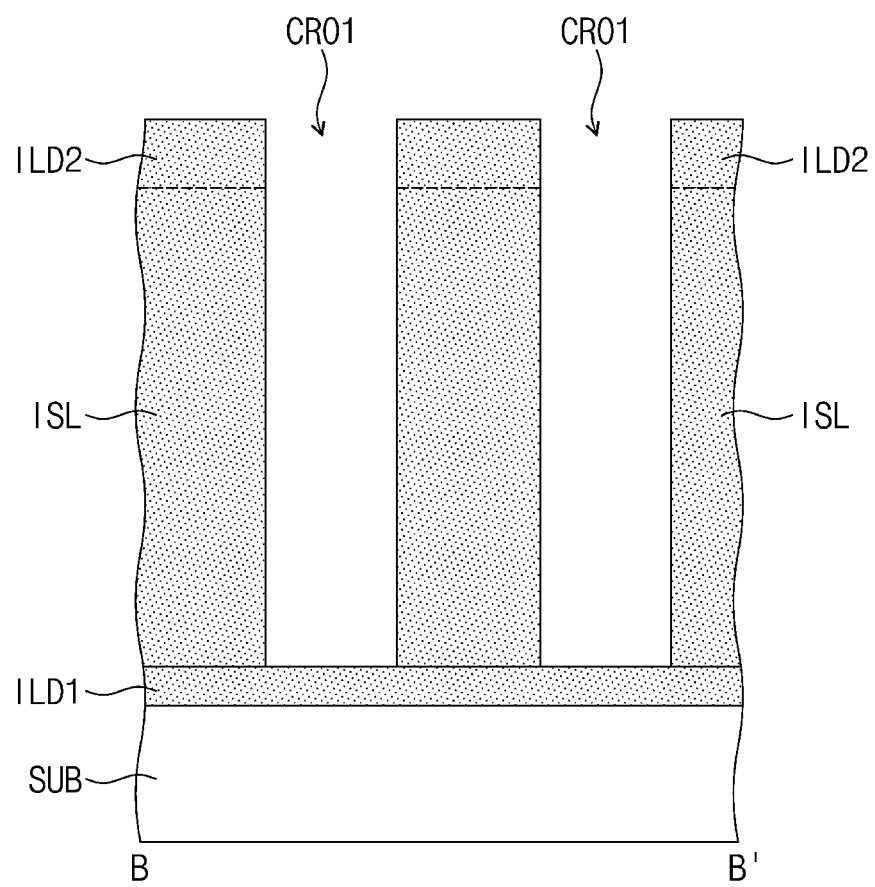
FIGS. 8B, 10B, 12B and 14B are cross-sectional views taken along lines B-B' of FIGS. 7, 9, 11 and 13, respectively.
Figure 9:
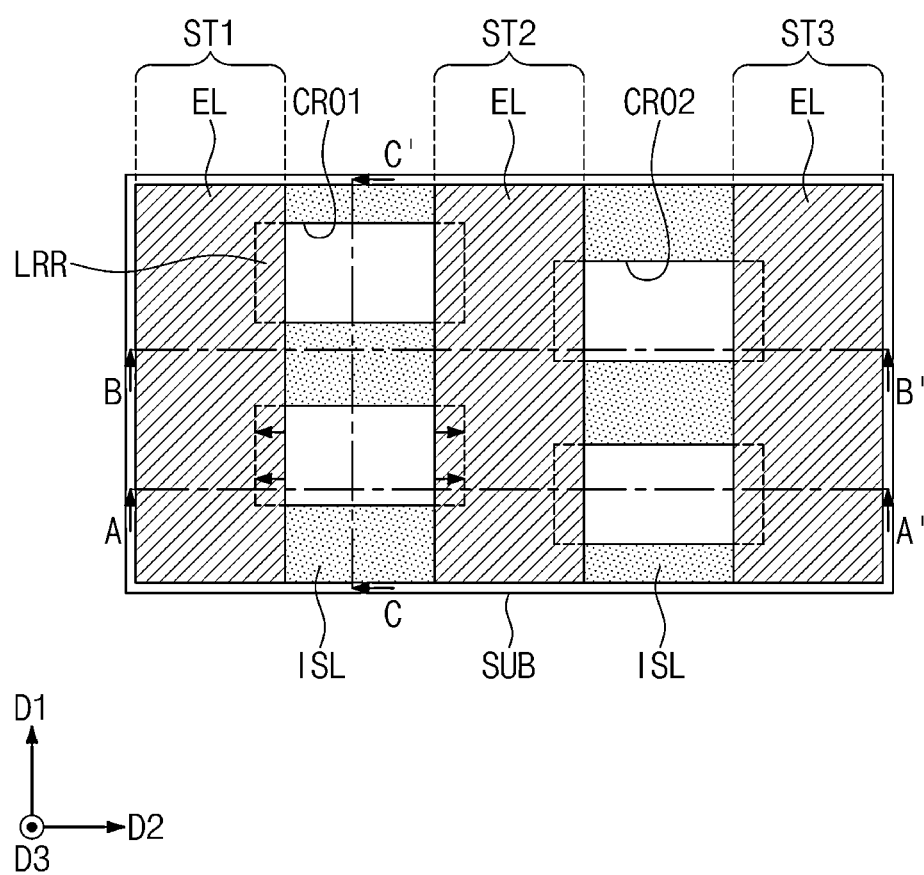

Referring to FIGS. 7, 8A and 8B, a second interlayer insulating layer ILD2 covering the first to third electrode structures ST1, ST2 and ST3 may be formed on an entire top surface of the substrate SUB. The second interlayer insulating layer ILD2 may be formed such that the insulting material comprising the second interlayer ILD2 completely fills the trenches TR. The second interlayer insulating layer ILD2 may be formed with a sufficient thickness to cover top surfaces of the first to third electrode structures ST1, ST2 and ST3.

The second interlayer insulating layer ILD2 may be formed of an insulating material having an etch selectivity with respect to the insulating layers IL. The second interlayer insulating layer ILD2 may include at least one of a silicon oxide layer, a silicon nitride layer, a silicon oxynitride layer, and/or the like. For example, the second interlayer insulating layer ILD2 may be formed of a silicon nitride layer.

The second interlayer insulating layer ILD2 filling the trench TR may be referred as an isolation insulating layer ISL. Thus, the first and second electrode structures ST1 and ST2 may be spaced apart from each other in the second direction D2 with the isolation insulating layer ISL interposed therebetween. The second and third electrode structures ST2 and ST3 may be spaced apart from each other in the second direction D2 with the isolation insulating layer ISL interposed therebetween.

Cell-open holes CRO1 and CRO2 may be formed to penetrate the isolation insulating layer ISL. The formation of the cell-open holes CRO1 and CRO2 may include forming a mask layer having openings on the second interlayer insulating layer ILD2, and anisotropically etching the isolation insulating layer ISL using the mask layer as an etch mask.

The cell-open holes CRO1 and CRO2 may include first cell-open holes CRO1 penetrating the isolation insulating layer ISL between the first and second electrode structures ST1 and ST2, and second cell-open holes CRO2 penetrating the isolation insulating layer ISL between the second and third electrode structures ST2 and ST3. The first cell-open holes CRO1 may be arranged in the first direction D1 between the first and second electrode structures ST1 and ST2. The second cell-open holes CRO2 may be arranged in the first direction D1 between the second and third electrode structures ST2 and ST3.

The first cell-open hole CRO1 may be slightly offset from the second cell-open hole CRO2. For example, the first cell-open hole CRO1 may be slightly offset from the second cell-open hole CRO2 adjacent thereto in the first direction D1. The first and second cell-open holes CRO1 and CRO2 may be arranged in a zigzag form when viewed in a plan view.

Referring to FIGS. 9 and 10A to 10C, a wet etching process may be performed on the insulating layers IL exposed by the first and second cell-open holes CRO1 and CRO2. The insulating layers IL exposed by the first and second cell-open holes CRO1 and CRO2 may be selectively and partially etched to form horizontal recess regions LRR.

The insulating layer IL may be horizontally recessed in a direction parallel to the second direction D2 to form the horizontal recess region LRR. The horizontal recess region LRR may be formed between the electrodes EL vertically adjacent to each other. Three surfaces of a side SDP of the electrode EL may be exposed by the horizontal recess region LRR. For example, a bottom surface BTS, a side surface SIS and a top surface TPS of the side SDP of the electrode EL may be exposed by the cell-open hole CRO1 or CRO2.

By the horizontal recess regions LRR, a sidewall of each of the first and second cell-open holes CRO1 and CRO2 may have an uneven profile. The wet etching process may selectively etch the insulating layers IL but may not etch the isolation insulating layer ISL as illustrated in FIG. 10C.

Referring to FIGS. 11 and 12A to 12C, a ferroelectric layer FE, a channel layer SEL and an isolation insulating pattern ISP may be sequentially formed in each of the first and second cell-open holes CRO1 and CRO2. The ferroelectric layer FE may be conformally formed in each of the first and second cell-open holes CRO1 and CRO2 by a deposition process such as an atomic layer deposition (ALD) process, a chemical vapor deposition (CVD) process, and/or the like. The ferroelectric layer FE may be formed to cover the bottom surface BTS, the side surface SIS and the top surface TPS of the side SDP of the electrode EL. In at least some embodiments, the ferroelectric layer FE may be formed of a Hf compound having ferroelectric properties.

The channel layer SEL may be conformally formed on the ferroelectric layer FE by a deposition process such as an ALD process, a CVD process, and/or the like. The channel layer SEL may include a first horizontal extension HP1 on the bottom surface BTS of the side SDP of the electrode EL, a vertical extension VP on the side surface SIS, and a second horizontal extension HP2 on the top surface TPS. The channel layer SEL may be formed of at least one of a semiconductor material, such as an elemental semiconductor, a compound semiconductor, an amorphous oxide semiconductor, and/or a two-dimensional semiconductor material. For example, the channel layer SEL may be formed of the amorphous oxide semiconductor (e.g., IGZO).

The isolation insulating pattern ISP may be formed to fill an empty space of the cell-open hole CRO1 and/or CRO2. The isolation insulating pattern ISP may be formed of at least one of silicon oxide, silicon nitride, or silicon oxynitride. The isolation insulating pattern ISP may include a pillar portion VTP having a vertically extending pillar shape, and a plurality of protrusions PRP horizontally protruding from the pillar portion VTP. The protrusions PRP may be formed in the horizontal recess regions LRR, respectively.

Referring to FIGS. 13 and 14A to 14C, a first conductive pillar SLP and a second conductive pillar BLP may be formed to penetrate each of the cell-open holes CRO1 and CRO2. The isolation insulating pattern ISP may remain between the first conductive pillar SLP and the second conductive pillar BLP.

The formation of the first and second conductive pillars SLP and BLP may include forming through-holes penetrating the ferroelectric layer FE and the channel layer SEL, and filling the through-holes with a conductive material. As illustrated in FIG. 13, the channel layer SEL and the ferroelectric layer FE may be node-divided into a first cell string CSTR1 and a second cell string CSTR2 by the first and second conductive pillars SLP and BLP.

The first conductive pillar SLP, the second conductive pillar BLP and the isolation insulating pattern ISP therebetween between the first and second electrode structures ST1 and ST2 may constitute a first through-structure TRS1. The first through-structures TRS1 between the first and second electrode structures ST1 and ST2 may be arranged in the first direction D1. The first through-structures TRS1 adjacent to each other may be spaced apart from each other with the isolation insulating layer ISL interposed therebetween.

The first conductive pillar SLP, the second conductive pillar BLP and the isolation insulating pattern ISP therebetween between the second and third electrode structures ST2 and ST3 may constitute a second through-structure TRS2. The second through-structures TRS2 between the second and third electrode structures ST2 and ST3 may be arranged in the first direction D1. The second through-structures TRS2 adjacent to each other may be spaced apart from each other with the isolation insulating layer ISL interposed therebetween.

Referring again to FIGS. 2 and 3A to 3C, a third interlayer insulating layer ILD3 may be provided on the second interlayer insulating layer ILD2. A plurality of interconnection lines extending in the second direction D2 may be formed in an upper portion of the third interlayer insulating layer ILD3. The plurality of interconnection lines may include first and second bit lines BL1 and BL2 and first and second source lines SL1 and SL2. Contacts CNT electrically connecting the first source and bit lines SL1 and BL1 to the first through-structure TRS1 may be formed. Contacts CNT electrically connecting the second source and bit lines SL2 and BL2 to the second through-structure TRS2 may be formed.

Figure 15:
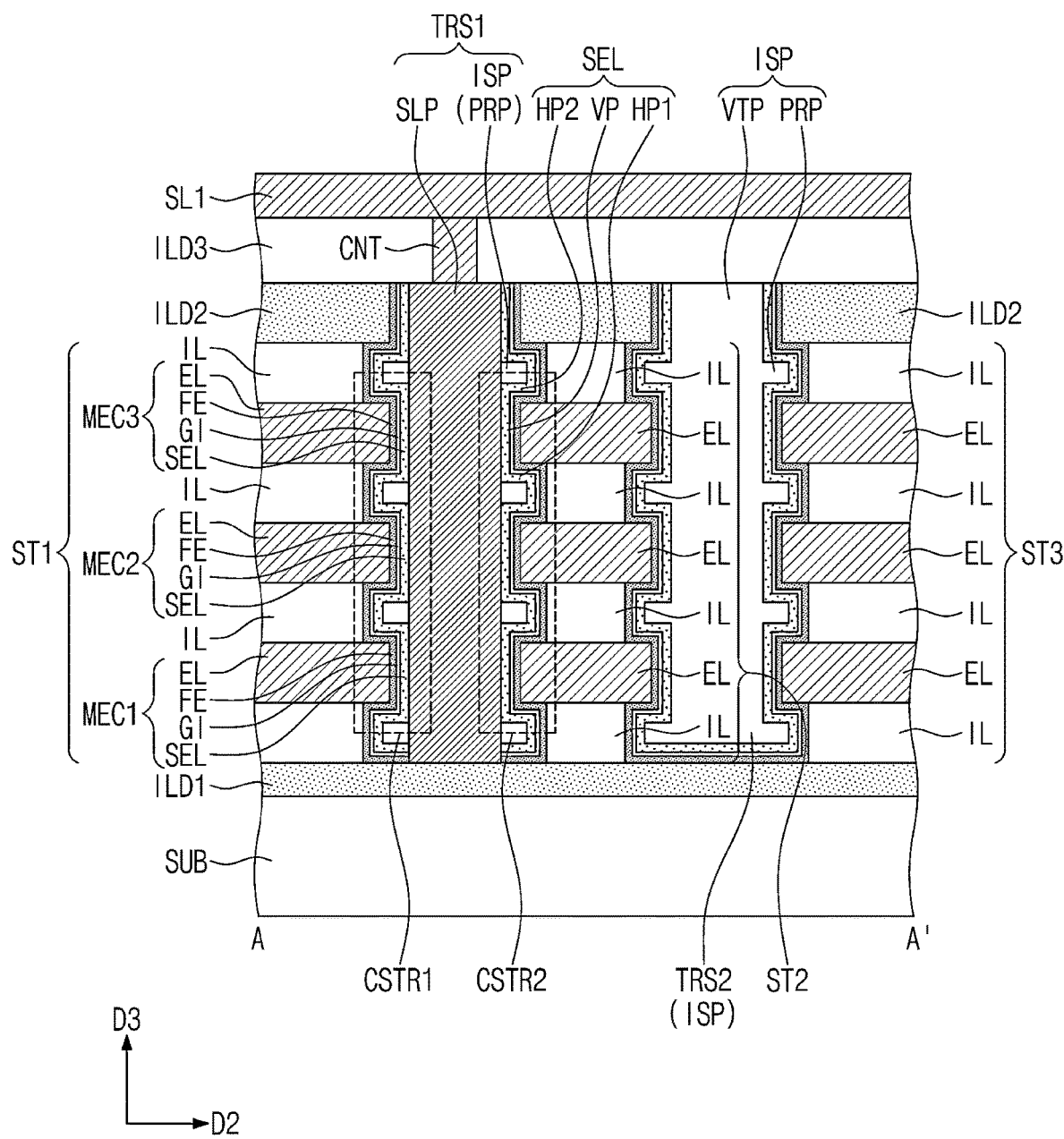
FIG. 15 is a cross-sectional view taken along the line A-A' of FIG. 2 to illustrate a 3D semiconductor memory device according to some embodiments of the inventive concepts.

FIG. 15 is a cross-sectional view taken along the line A-A' of FIG. 2 to illustrate a 3D semiconductor memory device according to some embodiments of the inventive concepts. In the present embodiments, the descriptions to the same technical features as mentioned above with reference to FIGS. 2, 3A to 3C and 4 will be omitted and differences between the present embodiments and the embodiments of FIGS. 2, 3A to 3C and 4 will be mainly described, for the purpose of ease and convenience in explanation.

Referring to FIGS. 2 and 15, a gate insulating layer GI may further be provided between the channel layer SEL and the ferroelectric layer FE. A memory cell transistor according to the present embodiments may include the gate insulating layer GI and the ferroelectric layer FE between a channel (e.g., the channel layer SEL) and a gate (e.g., the electrode EL). In some embodiments, a dielectric constant of the ferroelectric layer FE may be greater than a dielectric constant of the gate insulating layer GI. A thickness of the ferroelectric layer FE may be greater than a thickness of the gate insulating layer GI.

For example, the gate insulating layer GI may include a silicon oxide layer, a silicon oxynitride layer, a high-k dielectric layer having a dielectric constant higher than that of a silicon oxide layer, a combination thereof, and/or the like. The high-k dielectric layer may include a metal oxide or a metal oxynitride with a dielectric constant greater than silicon oxide. The thickness of the gate insulating layer GI may be less than the thicknesses of the ferroelectric layer FE and the channel layer SEL. For example, the thickness of the gate insulating layer GI may range from 0.5 nm to 5 nm.

Figure 16:
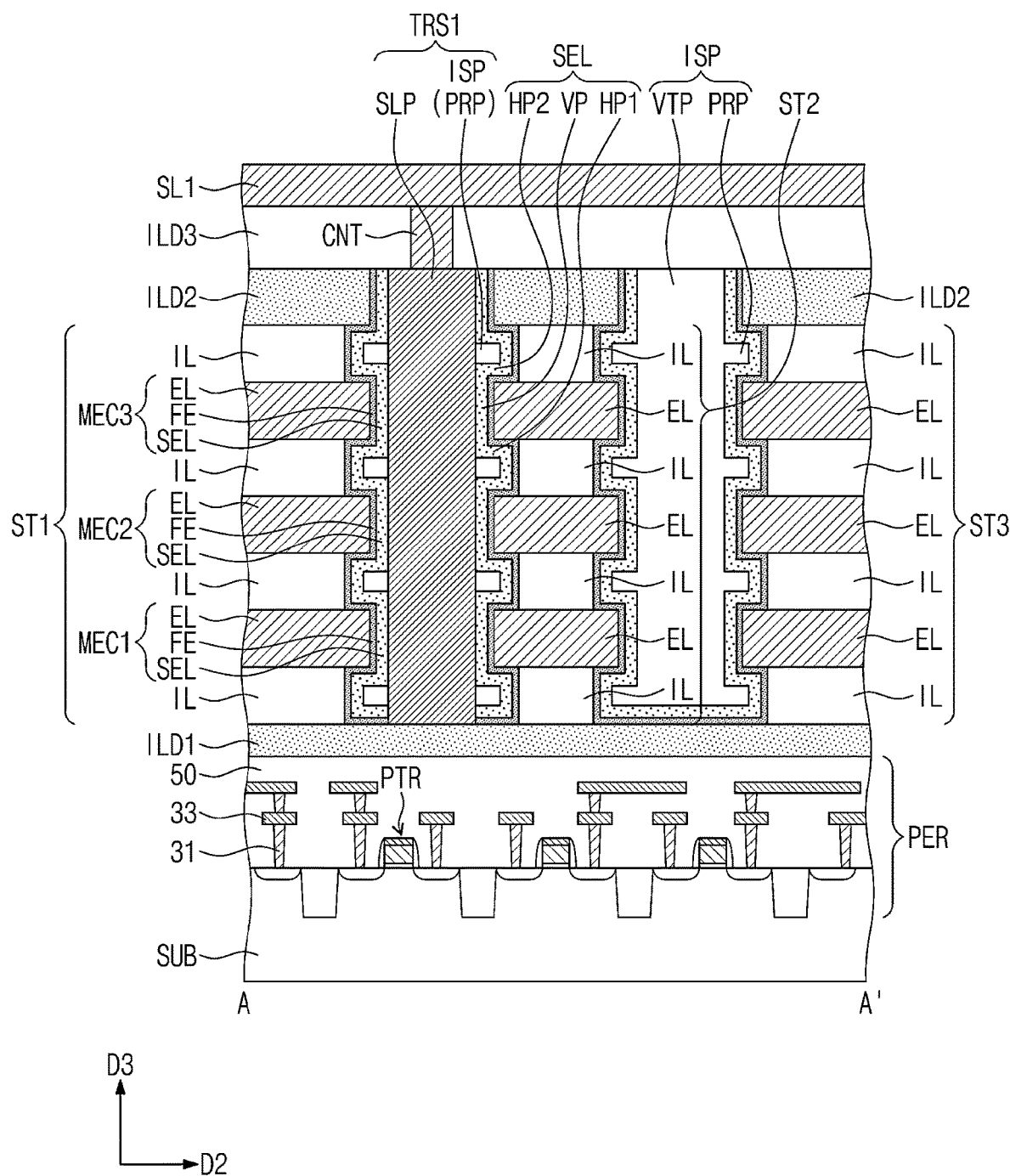
FIGS. 16, 17 and 18 are cross-sectional views illustrating 3D semiconductor memory devices according to some embodiments of the inventive concepts.
Figure 17:
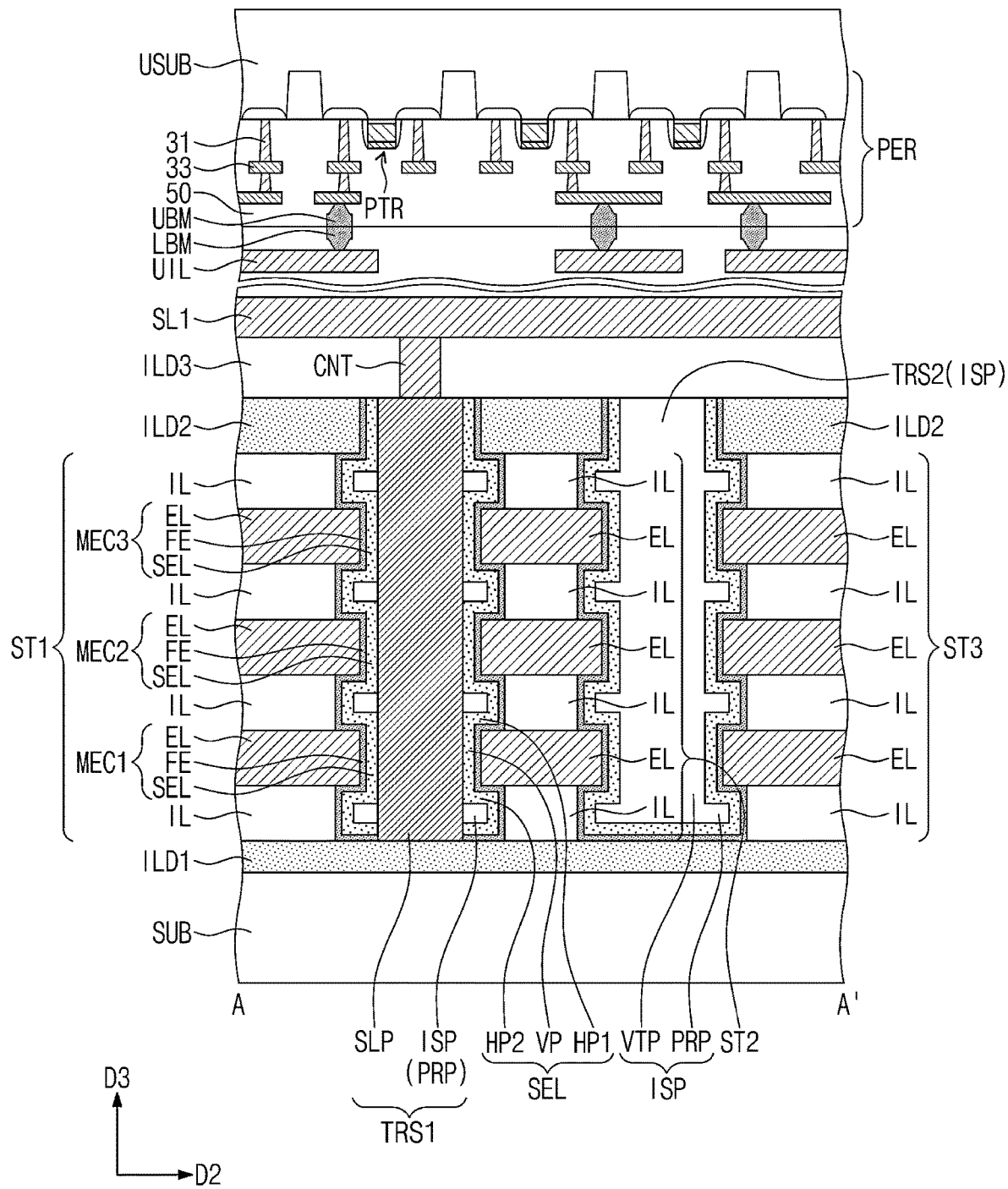
Figure 18:
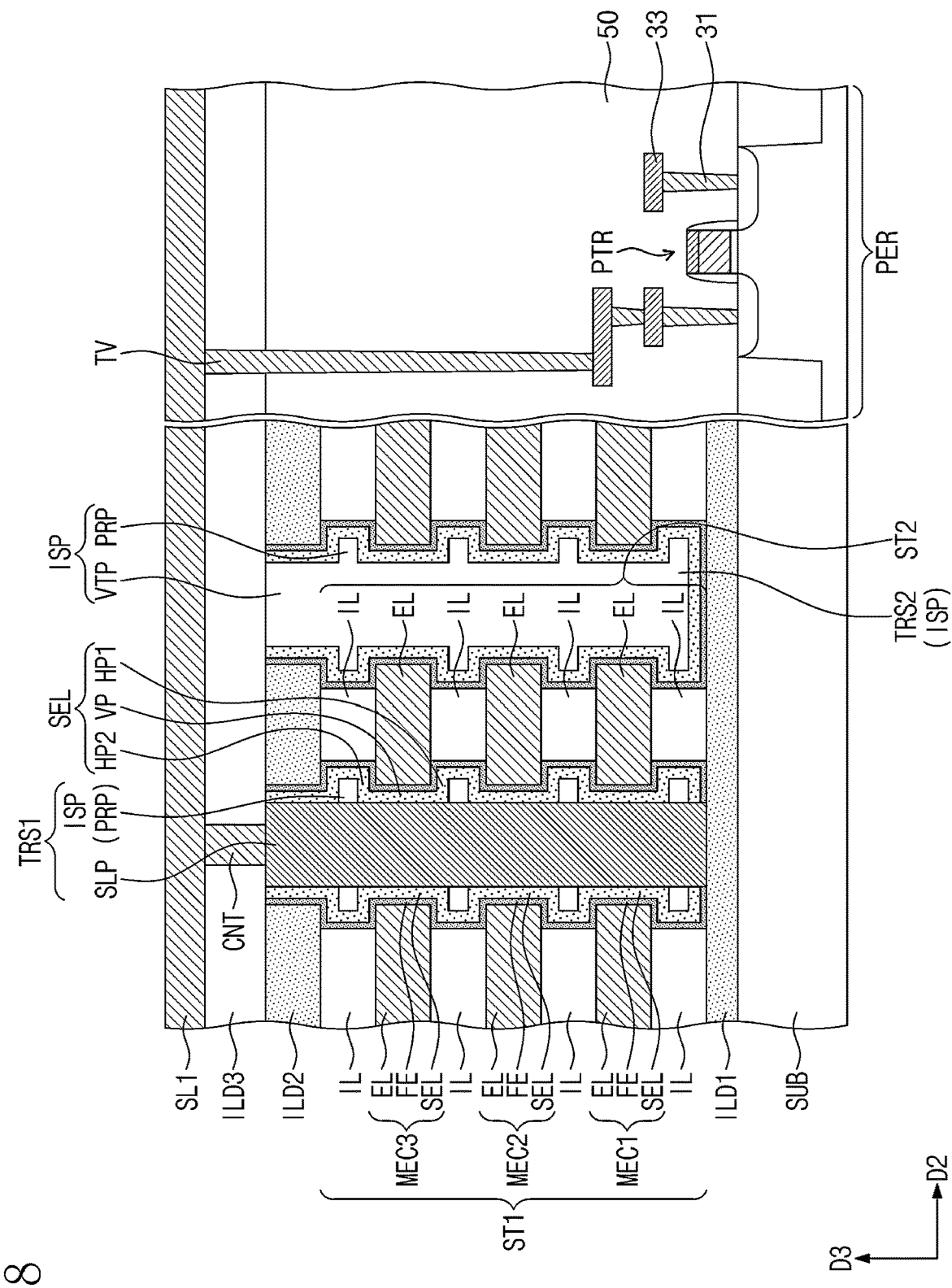

FIGS. 16, 17 and 18 are cross-sectional views illustrating 3D semiconductor memory devices according to some embodiments of the inventive concepts.

Referring to FIG. 16, a peripheral circuit layer PER may be provided on (or in) the substrate SUB. The peripheral circuit layer PER may be disposed between the substrate SUB and the first interlayer insulating layer ILD1. In other words, the peripheral circuit layer PER may be provided under a memory cell array including the electrode structures ST1 to ST3. A 3D semiconductor memory device according to the present embodiments may have a cell-on-peri (COP) structure.

The peripheral circuit layer PER may include a plurality of peripheral transistors PTR and peripheral interconnection lines 33 on the substrate SUB. The peripheral transistors PTR and the peripheral interconnection lines 33 may be covered with an interlayer insulating layer 50. The peripheral interconnection lines 33 may be provided on the peripheral transistors PTR and may be connected to the peripheral transistors PTR through contacts 31.

In some embodiments, the peripheral circuit layer PER may include sense amplifiers, row decoders and/or sub-word line drivers, which are electrically connected to the memory cells MEC1 to MEC3.

Referring to FIG. 17, a peripheral circuit layer PER and an upper substrate USUB may be provided on the memory cell array including the electrode structures ST1 to ST3. The peripheral circuit layer PER may be substantially the same as described above with reference to FIG. 16. A 3D semiconductor memory device according to the present embodiments may have a chip-to-chip (C2C) structure.

The peripheral circuit layer PER may be provided to face the substrate SUB. In other words, the upper substrate USUB may be located at an uppermost position so as to be exposed to the outside. Upper interconnection lines UIL and lower bonding metals LBM may be provided in an uppermost portion of the memory cell array. The lower bonding metals LBM may be provided on the upper interconnection lines UIL, respectively. The upper interconnection lines UIL may be provided in an uppermost metal layer above the first bit and source lines BL1 and SL1 and the second bit and source lines BL2 and SL2.

Upper bonding metals UBM may be provided in a lowermost portion of the peripheral circuit layer PER. Each of the upper bonding metals UBM may be connected to a corresponding one of the peripheral interconnection lines 33. Each of the lower bonding metals LBM may be connected to a corresponding one of the upper bonding metals UBM by a metal bonding method. For example, the metal bonding method may be a Cu—Cu bonding method. Since the lower bonding metal LBM is connected to the upper bonding metal UBM, the memory cells MEC1 to MEC3 may be connected to the peripheral circuit layer PER.

Referring to FIG. 18, a peripheral circuit layer PER may be provided on a peripheral region of the substrate SUB. The peripheral circuit layer PER may be disposed at a side of the memory cell array including the electrode structures ST1 to ST3. The peripheral circuit layer PER may be substantially the same as described above with reference to FIG. 16.

The first bit and source lines BL1 and SL1 and the second bit and source lines BL2 and SL2 may extend from the memory cell array onto the peripheral circuit layer PER. Peripheral interconnection lines 33 of the peripheral circuit layer PER may be electrically connected to the lines BL1, SL1, BL2 and SL2 through through-vias TV.

The 3D semiconductor memory device of the inventive concepts may have the three-dimensional thin film transistor structure in which the channel layer three-dimensionally surrounds the side of the electrode. Thus, the on-current properties of the memory cell transistor may be improved.

In the 3D semiconductor memory device of the inventive concepts, the horizontal word line may have the line shape without a change in line width and may connect the cell strings. Thus, a resistance of the horizontal word line may be reduced to improve the electrical characteristics of the 3D semiconductor memory device.

While the example embodiments of the inventive concepts have been particularly shown and described, it will be understood by one of ordinary skill in the art that variations in form and detail may be made therein without departing from the spirit and scope of the attached claims.

What is claimed is:

1. A three-dimensional (3D) semiconductor memory device comprising:
   a first through-structure on a substrate, the first through-structure comprising a first conductive pillar and a second conductive pillar spaced apart from each other in a first direction;
   an electrode adjacent to the first through-structure, the electrode horizontally extending in the first direction; and
   a ferroelectric layer and a channel layer between the electrode and the first and second conductive pillars,
   wherein the channel layer connects the first and second conductive pillars to each other,
   wherein the ferroelectric layer is between the electrode and the channel layer,
   wherein the ferroelectric layer extends from a sidewall of the first conductive pillar to a sidewall of the second conductive pillar along the channel layer when viewed in a plan view such that the ferroelectric layer is in contact with the sidewall of the first conductive pillar and the sidewall of the second conductive pillar, and
   wherein the ferroelectric layer has a C-shape surrounding the channel layer when viewed in the plan view.

2. The 3D semiconductor memory device of claim 1, wherein the first through-structure further comprises an isolation insulating pattern between the first and second conductive pillars, and
   wherein the channel layer extends from the first conductive pillar to the second conductive pillar across the isolation insulating pattern in the first direction.

3. The 3D semiconductor memory device of claim 1, wherein the channel 4. layer comprises
   a first horizontal extension on a bottom surface of the electrode;
   a second horizontal extension on a top surface of the electrode; and
   a vertical extension on a sidewall of the electrode.

4. The 3D semiconductor memory device of claim 1, further comprising:
   an isolation insulating layer adjacent to the first conductive pillar,
   wherein a first portion of the sidewall of the first conductive pillar is in contact with the channel layer and the ferroelectric layer, and wherein a second portion of the sidewall of the first conductive pillar is in contact with the isolation insulating layer.

5. The 3D semiconductor memory device of claim 1, wherein the channel layer includes at least one of an elemental semiconductor material, a compound semiconductor material, an amorphous oxide semiconductor, or a two-dimensional semiconductor material.

6. The 3D semiconductor memory device of claim 1, wherein the ferroelectric layer includes a Hf-based oxide and at least one impurity selected from a group consisting of Zr, Si, Al, Y, Gd, La, Sc and Sr.

7. The 3D semiconductor memory device of claim 1, further comprising:
    a second through-structure spaced apart, in a second direction intersecting the first direction, from the first through-structure such that the electrode is interposed therebetween,
    wherein the first through-structure is offset from the second through-structure in the first direction.

8. The 3D semiconductor memory device of claim 1, further comprising:
    a peripheral circuit layer on the substrate; and
    an interlayer insulating layer between the peripheral circuit layer and the first through-structure,
    wherein the peripheral circuit layer comprises peripheral transistors.

9. The 3D semiconductor memory device of claim 1, further comprising:
    interconnection lines on the first and second conductive pillars and electrically connected to the first and second conductive pillars, respectively;
    a peripheral circuit layer on the interconnection lines;
    an upper substrate on the peripheral circuit layer; and
    bonding metals between the peripheral circuit layer and the interconnection lines.

10. A three-dimensional (3D) semiconductor memory device comprising:
    a first through-structure and a second through-structure on a substrate, the first and second through-structures spaced apart in a first direction, and each comprising a first conductive pillar and a second conductive pillar spaced apart from each other in the first direction;
    an electrode extending horizontally in the first direction such that the electrode is adjacent to the first and second through-structures;
    a first memory cell between the electrode and the first through-structure; and
    a second memory cell between the electrode and the second through-structure,
    wherein each of the first and second memory cells comprises a ferroelectric layer and a channel layer,
    wherein the electrode extends from the first memory cell to the second memory cell while having a constant line width, and
    wherein the ferroelectric layer has a C-shape surrounding the channel layer when viewed in a plan view.

11. The 3D semiconductor memory device of claim 10, further comprising:
    an isolation insulating layer between the first through-structure and the second through-structure,
    wherein a sidewall of the first conductive pillar of the first through-structure includes
        a first portion in contact with the channel layer and the ferroelectric layer, and
        a second portion in contact with the isolation insulating layer.

12. The 3D semiconductor memory device of claim 10, wherein the electrode is connected to a word line,
    wherein the first conductive pillar of each of the first and second through-structures is connected to a source line, and
    wherein the second conductive pillar of each of the first and second through-structures is connected to a bit line.

13. The 3D semiconductor memory device of claim 10, wherein the ferroelectric layer of each of the first and second memory cells is in contact with a sidewall of the first conductive pillar and in contact with a sidewall of the second conductive pillar.

14. The 3D semiconductor memory device of claim 10, wherein the channel layer of each of the first and second memory cells comprises
    a first horizontal extension on a bottom surface of the electrode,
    a second horizontal extension on a top surface of the electrode, and
    a vertical extension on a sidewall of the electrode.

15. A three-dimensional (3D) semiconductor memory device comprising:
    an electrode structure comprising a plurality of electrodes stacked on a substrate, the electrode structure extending in a first direction;
    a first through-structure adjacent to a first side of the electrode structure;
    a second through-structure adjacent to a second side, opposite to the first side, of the electrode structure;
    a first cell string between the electrode structure and the first through-structure;
    a second cell string between the electrode structure and the second through-structure; and
    interconnection lines on the first and second cell strings,
    wherein each of the first and second through-structures comprises a first conductive pillar and a second conductive pillar spaced apart from each other in the first direction,
    wherein each of the first and second cell strings comprises a channel layer connecting the first conductive pillar and the second conductive pillar and a ferroelectric layer between the channel layer and the electrode structure,
    wherein the first through-structure is offset from the second through-structure in the first direction by a first pitch, and
    wherein the ferroelectric layer has a C-shape surrounding the channel layer when viewed in a plan view.

16. The 3D semiconductor memory device of claim 15, wherein the interconnection lines comprise
    a first source line electrically connected to the first conductive pillar of the first through-structure, and
    a second source line electrically connected to the first conductive pillar of the second through-structure,
    wherein a second pitch between the first and second source lines is equal to the first pitch.

17. The 3D semiconductor memory device of claim 15, wherein the interconnection lines comprise
    a first bit line electrically connected to the second conductive pillar of the first through-structure, and
    a second bit line electrically connected to the second conductive pillar of the second through-structure,
    wherein a second pitch between the first and second bit lines is equal to the first pitch.

18. The 3D semiconductor memory device of claim 15, wherein the first cell string comprises a plurality of first memory cells between the first through-structure and the plurality of electrodes, respectively, and wherein the second cell string comprises: a plurality of second memory cells between the second through-structure and the plurality of electrodes, respectively.

19. The 3D semiconductor memory device of claim 15, wherein the ferroelectric layer of each of the first and second cell strings is in contact with a sidewall of the first conductive pillar and in contact with a sidewall of the second conductive pillar.

* * * * *